(12) United States Patent
Liao et al.

(10) Patent No.: US 12,142,640 B2
(45) Date of Patent: Nov. 12, 2024

(54) SEMICONDUCTOR STRUCTURES WITH MULTIPLE THRESHOLD VOLTAGE OFFERINGS AND METHODS THEREOF

(71) Applicant: Taiwan Semiconductor Manufacturing Company, Ltd., Hsinchu (TW)

(72) Inventors: Shan-Mei Liao, Hsinchu (TW); Yung-Hsiang Chan, Hsinchu (TW); Yao-Teng Chuang, Hsinchu (TW); Jian-Hao Chen, Hsinchu (TW); Kuo-Feng Yu, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 406 days.

(21) Appl. No.: 17/482,011

(22) Filed: Sep. 22, 2021

(65) Prior Publication Data

US 2022/0320293 A1    Oct. 6, 2022

Related U.S. Application Data

(60) Provisional application No. 63/168,534, filed on Mar. 31, 2021.

(51) Int. Cl.
*H01L 21/8238* (2006.01)
*H01L 27/092* (2006.01)
(Continued)

(52) U.S. Cl.
CPC .... *H01L 29/152* (2013.01); *H01L 21/823857* (2013.01); *H01L 27/092* (2013.01);
(Continued)

(58) Field of Classification Search
CPC .......... H01L 29/152; H01L 21/823857; H01L 27/092; H01L 29/0665; H01L 29/401;
(Continued)

(56) References Cited

U.S. PATENT DOCUMENTS

| 8,836,016 B2 | 9/2014 | Wu et al. |
| 8,841,701 B2 | 9/2014 | Lin et al. |

(Continued)

FOREIGN PATENT DOCUMENTS

| CN | 112563267 A | 3/2021 |
| TW | 201933446 A | 8/2019 |

OTHER PUBLICATIONS

Huang, Mao-Lin, et al., "Gate Patterning Process for Multi-Gate Devices", U.S. Appl. No. 16/858,440, filed Apr. 24, 2020. 32 pages of specification and 38 pages of drawings.

(Continued)

*Primary Examiner* — Bitew A Dinke
(74) *Attorney, Agent, or Firm* — HAYNES AND BOONE, LLP

(57) ABSTRACT

A method includes receiving a workpiece having a first stack of semiconductor layers in a first region and a second stack of semiconductor layers in a second region; forming a first gate dielectric layer surrounding each layer of the first stack and a second gate dielectric layer surrounding each layer of the second stack; forming a first dipole layer surrounding the first gate dielectric layer and merging between vertically adjacent portions of the first gate dielectric layer, and a second dipole layer surrounding the second gate dielectric layer and merging between vertically adjacent portions of the second gate dielectric layer; removing the first dipole layer; after the removing of the first dipole layer, conducting a first annealing on the workpiece; removing a remaining (Continued)

portion of the second dipole layer; and forming a gate electrode layer in the first region and the second region.

20 Claims, 25 Drawing Sheets

(51) Int. Cl.
H01L 29/06 (2006.01)
H01L 29/15 (2006.01)
H01L 29/40 (2006.01)
H01L 29/423 (2006.01)
H01L 29/51 (2006.01)
H01L 29/66 (2006.01)
H01L 29/786 (2006.01)

(52) U.S. Cl.
CPC ........ *H01L 29/0665* (2013.01); *H01L 29/401* (2013.01); *H01L 29/42392* (2013.01); *H01L 29/517* (2013.01); *H01L 29/66742* (2013.01); *H01L 29/7869* (2013.01)

(58) Field of Classification Search
CPC ............. H01L 29/42392; H01L 29/517; H01L 29/66742; H01L 29/7869; H01L 21/28185; H01L 29/513; H01L 29/78696; H01L 29/1079; H01L 29/165; H01L 29/66545; H01L 29/7848; H01L 29/0673; H01L 29/66439; H01L 29/42376; H01L 29/775; H01L 21/823437; H01L 21/823412; H01L 21/823431; H01L 21/823462; H01L 27/0886; B82Y 10/00
See application file for complete search history.

(56) References Cited

U.S. PATENT DOCUMENTS

| 8,847,293 | B2 | 9/2014 | Lee et al. |
| 8,853,025 | B2 | 10/2014 | Zhang et al. |
| 8,962,400 | B2 | 2/2015 | Tsai et al. |
| 9,093,514 | B2 | 7/2015 | Tsai et al. |
| 9,236,267 | B2 | 1/2016 | De et al. |
| 9,245,805 | B2 | 1/2016 | Yeh et al. |
| 9,520,482 | B1 | 12/2016 | Chang et al. |
| 9,576,814 | B2 | 2/2017 | Wu et al. |
| 10,825,736 | B1* | 11/2020 | Zhang ................... H01L 29/775 |
| 11,791,218 | B2* | 10/2023 | Chu ....................... H01L 29/785 257/365 |
| 11,869,955 | B2* | 1/2024 | Yu ....................... H01L 29/0673 |
| 2019/0318967 | A1* | 10/2019 | Chen ............... H01L 21/823462 |
| 2019/0371903 | A1* | 12/2019 | Bao ................... H01L 21/28185 |
| 2020/0043808 | A1* | 2/2020 | Bao ................... H01L 21/28088 |
| 2020/0058558 | A1* | 2/2020 | Chu ..................... H01L 27/0922 |
| 2020/0083326 | A1 | 3/2020 | Ok et al. |
| 2020/0119019 | A1* | 4/2020 | Tsai ................. H01L 21/823871 |
| 2020/0258785 | A1* | 8/2020 | Zhang ............. H01L 21/823462 |
| 2020/0258786 | A1* | 8/2020 | Ando ................. H01L 21/02532 |
| 2020/0258995 | A1* | 8/2020 | Bao ................... H01L 29/66439 |
| 2020/0373300 | A1* | 11/2020 | Zhang ............... H01L 21/28158 |
| 2021/0066137 | A1* | 3/2021 | Hsu ....................... H01L 29/517 |
| 2021/0210388 | A1* | 7/2021 | Zhang ............... H01L 29/66439 |
| 2021/0265481 | A1 | 8/2021 | Huang et al. |
| 2022/0199796 | A1* | 6/2022 | Zhang ................. H01L 29/0665 |
| 2022/0375936 | A1* | 11/2022 | Chu ........................ H01L 29/26 |
| 2023/0012216 | A1* | 1/2023 | Lin ........................ H01L 29/401 |

OTHER PUBLICATIONS

L. Lin and J. Robertson, "Atomic mechanism of electric dipole formed at high-K: SiO2 interface," Journal of Applied Physics 109, 094502 (2011): https://doi.org/10.1063/1.3583655.

Chen, Chun-Yuan et al., "Semiconductor Devices with Backside Air Gap Dielectric", U.S. Appl. No. 16/888,217, filed May 29, 2020, Assignee Taiwan Semiconductor Manufacturing Co., Ltd., 26 pages specification, 16 pages drawings.

Su, Huan-Chieh et al., "Backside Power Rail and Methods of Forming the Same", U.S. Appl. No. 16/901,963, filed Jun. 15, 2020, Assignee Taiwan Semiconductor Manufacturing Co., Ltd., 28 pages specification, 22 pages drawings.

Chen, Chun-Yuan et al., "Anchor-Shaped Backside Via and Method Thereof", U.S. Appl. No. 16/926,447, filed Jul. 10, 2020, Assignee Taiwan Semiconductor Manufacturing Co., Ltd., 32 pages specification, 16 pages drawings.

Yu, Jia-Ni, et al., "P-Metal Gate First Gate Replacement Process for Multigate Devices", U.S. Appl. No. 16/834,637, filed Mar. 30, 2020, 43 pages of specification, 24 pages of drawings.

Chu, Lung-Kun et al., "Dipole Patterning for CMOS Devices," U.S. Appl. No. 16/879,613, filed May 20, 2020, 31 pages of specification, 26 pages of drawings.

Chiang, Kuo-Cheng et al., "Semiconductor Devices With Backside Power Rail and Backside Self-Aligned Via," U.S. Appl. No. 17/080,521, filed Oct. 26, 2020, 37 pages of specification, 24 pages of drawings.

Hsu, Chung-Wei et al., "Semiconductor Device Fabrication Methods and Structures Thereof," U.S. Appl. No. 17/161,905, filed Jan. 29, 2021, 35 pages of specification, 25 pages drawings.

Koji Kita and Akira Toriumi, "Origin of electric dipoles formed at high-k/SiO2 interface," Journal of Applied Physics, vol. 94, Issue 13, 132902 (2009): https://doi.org/10.1063/1.3110968.

* cited by examiner

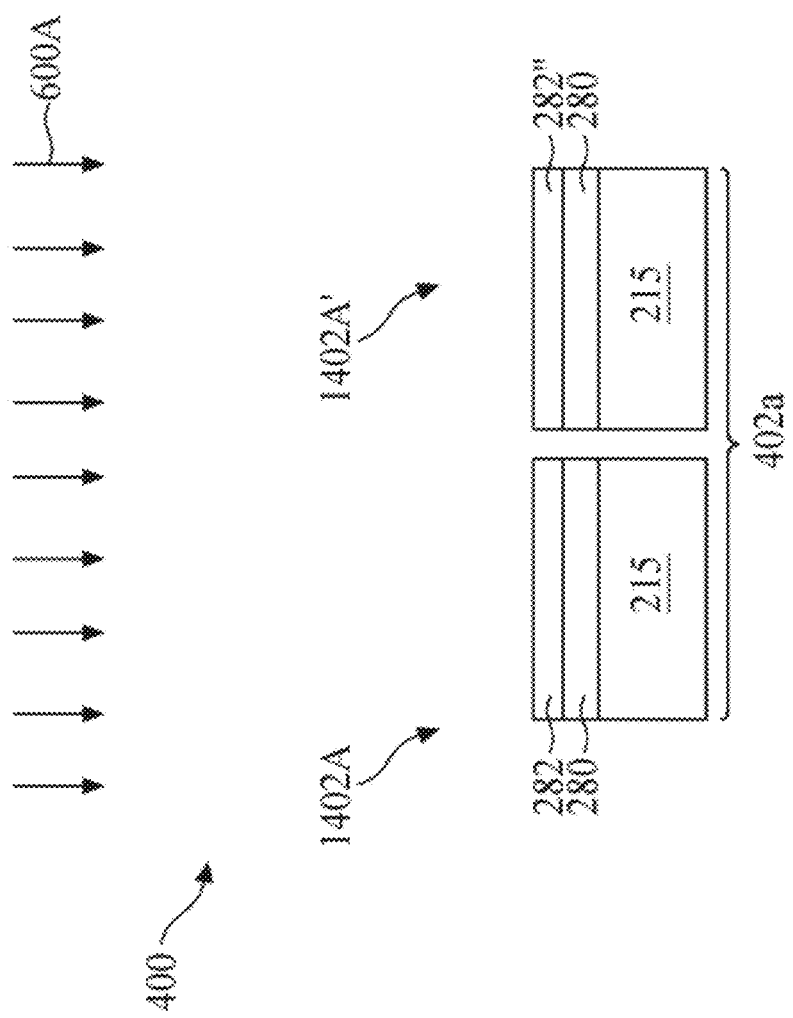

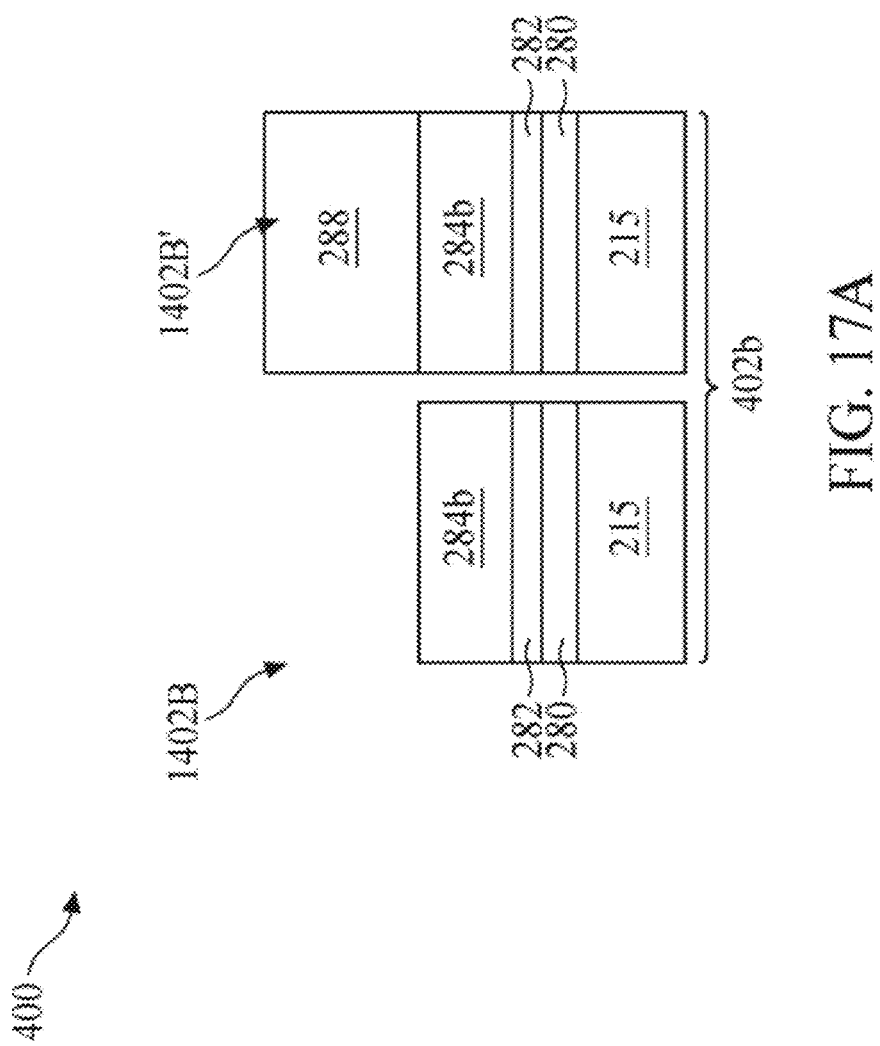

SEMICONDUCTOR STRUCTURES WITH MULTIPLE THRESHOLD VOLTAGE OFFERINGS AND METHODS THEREOF

PRIORITY

This application claims the benefits of and priority to U.S. Provisional Application Ser. No. 63/168,534 filed Mar. 31, 2021, the entire disclosure of which is incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Nanosheet-based devices (sometimes also referred to as gate-all-around devices, multi-bridge channel devices, etc.) are a promising candidate to take CMOS to the next stage of the roadmap due to their better gate control ability, lower leakage current, and full compatibility with FinFET device layout. However, due to the complex device structures and reduced spacing between features, it may be challenging to accomplish certain functions, such as to provide multiple threshold voltages, without incurring penalty to other performance characteristics. Therefore, although conventional technologies have been generally adequate for their intended purposes, they are not satisfactory in every respect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 4, 5, 6, 7, 8, 9, 10, 11, 12, 13, 15, 16A, 16B, 16C, 17A, 17B, 17C, and 18 are diagrammatic cross-sectional views of the semiconductor device in FIG. 2A, in portion, at various fabrication stages (such as those associated with the methods in FIG. 1 or FIG. 14) according to various aspects of the present disclosure.

DETAILED DESCRIPTION

Figure 1:
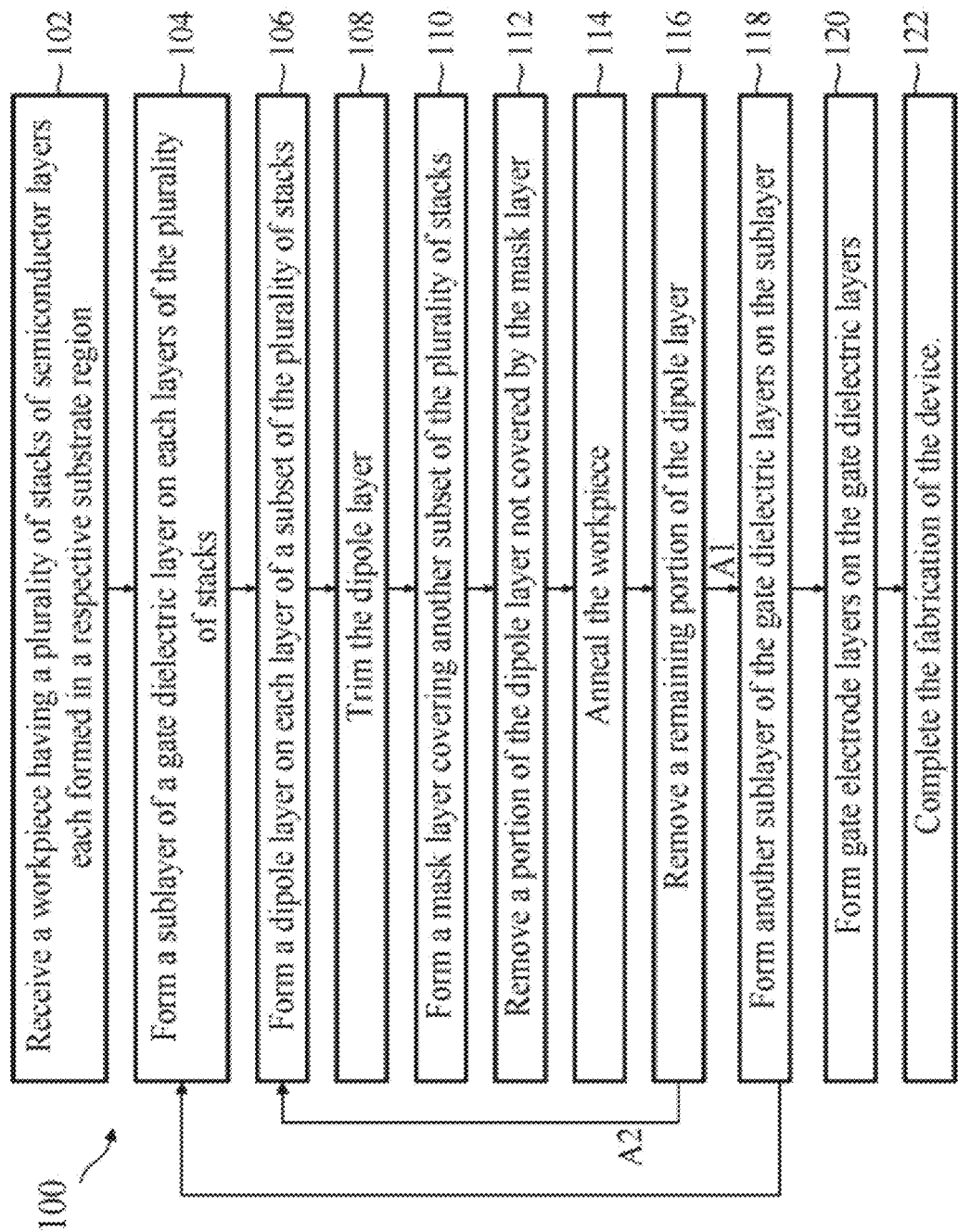
FIGS. 1 and 14 are flow charts of methods for fabricating a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, from 4.0 nm to 5.0 nm, and so on.

The present disclosure is generally related to ICs and semiconductor devices and methods of forming the same. More particularly, the present disclosure is related to semiconductor devices having multiple threshold voltages (Vt) (hereinafter referred to as multi-Vt devices). As the advanced technology nodes continue to scale down, it has become increasingly challenging to develop such multi-Vt devices. For example, dipole materials are sometimes embedded into gate dielectric layers (e.g. on the interface between the gate dielectric layer and the interfacial layer), with different configurations, to provide the desired multiple threshold voltages. For example, p-type dipole materials doped into the gate dielectric layer of a p-type transistor reduces the threshold voltage of the p-type transistor, whereas p-type dipole materials doped into the gate dielectric layer of an n-type transistor increases the threshold voltage of the n-type transistor. Similarly, n-type dipole materials doped into the gate dielectric layer of an n-type transistor reduces the threshold voltage of the n-type transistor, whereas n-type dipole materials doped into the gate dielectric layer of a p-type transistor increases the threshold voltage of the p-type transistor. In order to achieve such different configurations, dipole layers (including the dipole materials) are patterned with the aid of hard mask layers and photoresists. While n-type dipoles have been often used in such applications, it has been challenging to similarly implement the p-type dipoles. For example, suitable p-type dipoles include aluminum oxide ($Al_2O_3$). However, the solubility of aluminum oxide in both acid and alkaline wet etching chemicals renders most conventional hard mask materials unusable in the patterning of $Al_2O_3$-based dipole layers. This challenge is aggravated in the context of nanosheet-based devices where processing windows are extremely tight. In other words, there remains a challenge to implement $Al_2O_3$ in the gate dielectric layer as a dipole material. Accordingly, this present disclosure provides structures and methods that addresses these challenges. Additional processing is contemplated by the present disclosure.

Figure 2A:
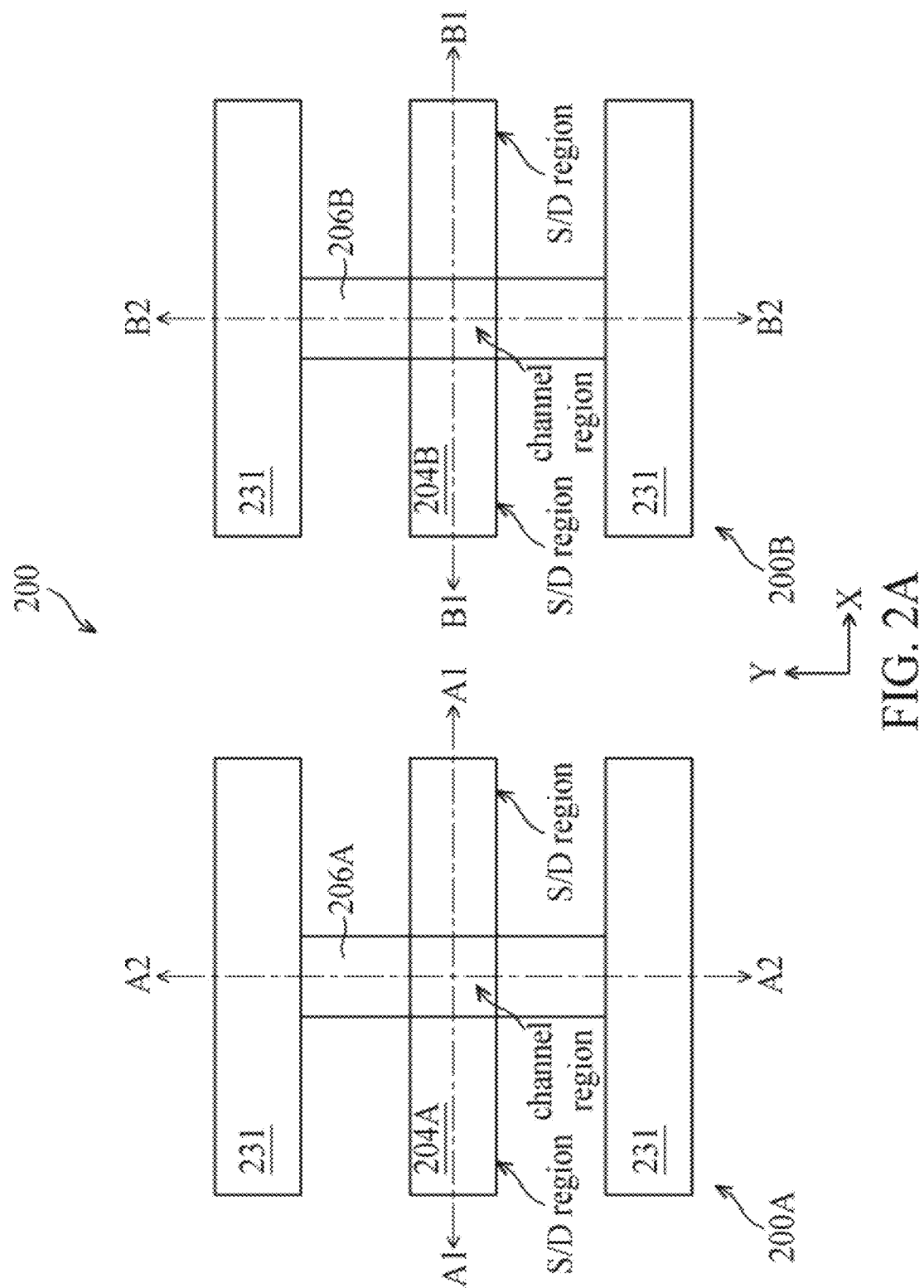
FIG. 2A is a diagrammatic top view of a semiconductor device, in portion, according to various aspects of the present disclosure.

FIG. 1 is a flow chart of a method 100 for fabricating a semiconductor device according to various aspects of the present disclosure. In some embodiments, the method 100 fabricates a semiconductor device that includes nanosheet-based transistors. It is noted that the term nanosheet-based devices broadly encompasses devices that include a plurality of channel layers stacked one on top of another, regardless of aspect ratios of the channel layers. In other words, the term nanosheet-based devices include devices with channel layers of nanosheet, nanowire, nanobar, or any other suitable shapes. They are sometimes also referred to as gate-all-around (GAA) device, multi-bridge-channel (MBC) device, or other similar names. Additional steps can be provided before, during, and after the method 100, and some of the steps described below can be moved, replaced, or eliminated for additional embodiments of the method 100. The method 100 is described below in conjunction with FIGS. 2A through 12. FIG. 2A is a diagrammatic top view of a semiconductor device 200, in portion, at a fabrication stage associated with method 100 according to various aspects of the present disclosure. FIGS. 2B-12 are diagrammatic cross-sectional views of the device 200, in portion, at various fabrication stage associated with method 100 according to various aspects of the present disclosure.

The device 200 is a multi-gate (or multigate) device in the present embodiments. One of ordinary skill may recognize other examples of semiconductor devices that may benefit from aspects of the present disclosure. The device 200 may be included in a microprocessor, a memory, and/or other IC devices. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, device 200 is included in a non-volatile memory, such as a non-volatile random-access memory (NVRAM), a flash memory, an electrically erasable programmable read only memory (EEPROM), an electrically programmable read-only memory (EPROM), other suitable memory type, or combinations thereof. FIGS. 2A-12 have been simplified for the sake of clarity to better understand the inventive concepts of the present disclosure. Additional features can be added in the device 200, and some of the features described below can be replaced, modified, or eliminated in other embodiments of the device 200. The fabrication of the device 200 is described below in conjunction with embodiments of the method 100.

Figure 2C:
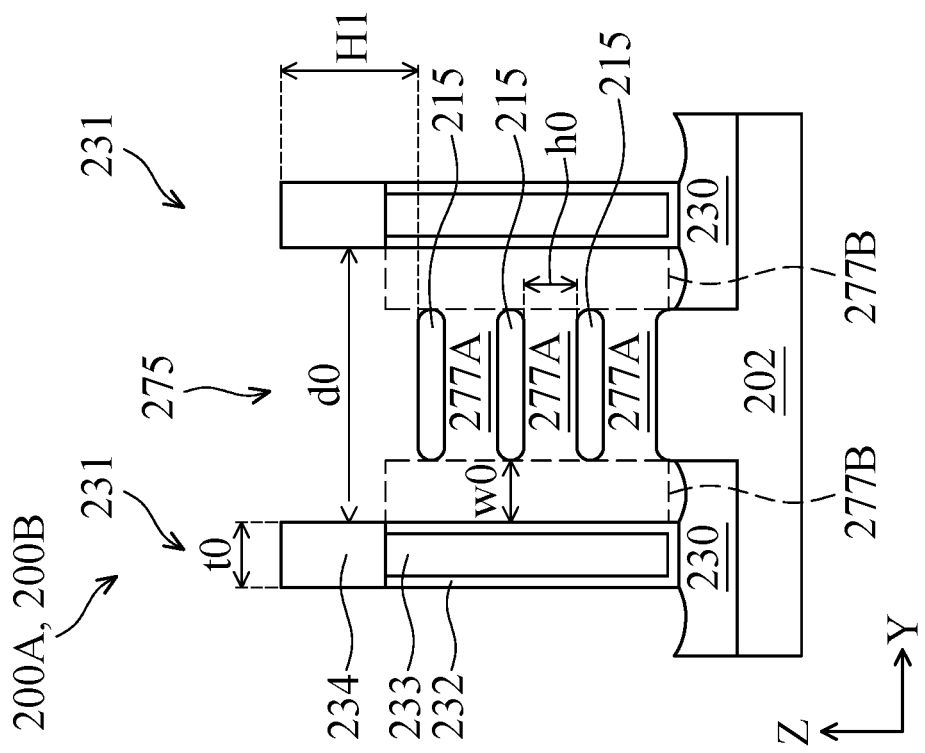
FIGS. 2B and 2C are diagrammatic cross-sectional views of the semiconductor device in FIG. 2A, in portion, according to an embodiment of the present disclosure.
Figure 2B:
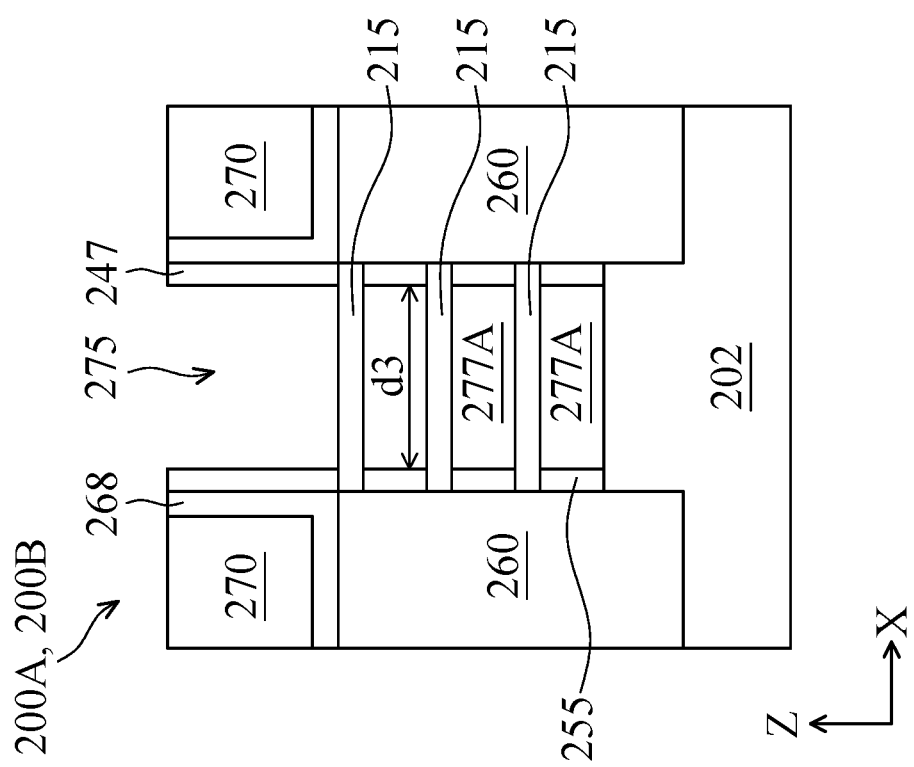

At operation 102, the method 100 (FIG. 1) provides or is provided with an initial structure (or workpiece) of the device 200, a portion of which is shown in FIGS. 2A-2C according to an embodiment. Particularly, FIG. 2A illustrates that the device 200 includes two device regions (or regions) 200A and 200B. The region 200A includes an active region 204A and a gate region 206A generally perpendicular to the active region 204A. The active region 204A includes a pair of source/drain (S/D) regions and a channel region between the pair of S/D regions. The gate region 206A engages the channel region. The region 200A further includes dielectric fins 231 that are oriented lengthwise generally parallel to the active region 204A and on both sides of the active region 204A. The gate region 206A extends along the "y" direction between the two dielectric fins 231. Similarly, the region 200B includes an active region 204B and a gate region 206B generally perpendicular to the active region 204B. The active region 204B includes a pair of S/D regions and a channel region between the pair of S/D regions. The gate region 206B engages the channel region. The region 200B further includes dielectric fins 231 that are oriented lengthwise generally parallel to the active region 204B and on both sides of the active region 204B. The gate region 206B extends along the "y" direction between the two dielectric fins 231.

FIG. 2B illustrates a cross-sectional view of the device 200 according to an embodiment, which is a cross-sectional view of the regions 200A and 200B along the A1-A1 and B1-B1 lines of FIG. 2A, respectively. FIG. 2C illustrates a cross-sectional view of the device 200 according to an embodiment, which is a cross-sectional view of the regions 200A and 200B along the A2-A2 and B2-B2 lines of FIG. 2A, respectively. The embodiments illustrated in FIGS. 2B and 2C are nanosheet-based devices, where their channel layers 215 are in the shape of nano-sized sheets. The regions 200A and 200B are illustrated as having the same configuration for the sake of clarity to better understand the inventive concepts of the present disclosure. In various embodiments, the regions 200A and 200B may have different configurations. For example, they may have different number of channels and/or their channel layers 215 can be of different shapes or dimensions. For another example, any of the regions 200A and 200B can be a nanowire FET (i.e., the channel layers 215 are in the shape of nano-sized wires or nano-sized rods) or a nanosheet FET. Moreover, as described later, the regions 200A and 200B are processed in different ways to form transistors with different features (e.g. with different threshold voltages).

Referring to FIGS. 2B-2C, the device 200 includes a substrate (such as a wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate.

Each of the regions 200A and 200B further includes a pair of S/D features 260. For n-type transistors, the S/D features 260 are of n-type. For p-type transistors, the S/D features 260 are of p-type. The S/D features 260 may be formed by epitaxially growing semiconductor material(s) (e.g., Si, SiGe) to fill trenches in the device 200, for example, using CVD deposition techniques (e.g., Vapor Phase Epitaxy), molecular beam epitaxy, other suitable epitaxial growth processes, or combinations thereof. Accordingly, the S/D features 260 may also be interchangeably referred to as the epitaxial S/D features 260 or epitaxial features 260. The S/D features 260 are doped with proper n-type dopants and/or p-type dopants. For example, for n-type transistors, the S/D features 260 may include silicon and be doped with carbon, phosphorous, arsenic, other n-type dopant, or combinations thereof; and for p-type transistors, the S/D features 260 may include silicon germanium or germanium and be doped with boron, other p-type dopant, or combinations thereof.

Each of the regions 200A and 200B further includes a stack of semiconductor layers 215 suspended over the substrate 202 and connecting the pair of the S/D features 260. The stack of semiconductor layers 215 serve as the transistor channels for the respective transistors. Accordingly, the semiconductor layers 215 are also referred to as channel layers 215. The channel layers 215 are exposed in a gate trench 275 which is resulted from the removal of a dummy gate from the respective gate region 206A and 206B (FIG. 2A) therein. The channel layers 215 may include single crystalline silicon. Alternatively, the channel layers 215 may include germanium, silicon germanium, or another suitable semiconductor material(s). Initially, the channel layers 215 are formed as part of a semiconductor layer stack that includes the channel layers 215 and other semiconductor layers of a different material. The semiconductor layer stack is patterned into a shape of a fin protruding above the substrate 202 using one or more photolithography processes, including double-patterning or multi-patterning processes. After the gate trenches 275 are formed, the semiconductor layer stack is selectively etched to remove the other semiconductor layers, leaving the channel layers 215 suspended over the substrate 202 and between the respective S/D features 260. The channel layers 215 are separated from each other and from the substrate 202 by gaps 277A.

In some embodiments, each channel layer 215 has nanometer-sized dimensions, thus may be referred to as nanostructures. For example, each channel layer 215 may have a length (along the "x" direction, which is perpendicular to a plane defined by the "y" direction and the "z" direction) about 10 nm to about 300 nm, and a width (along the "y" direction) about 10 nm to about 80 nm, and a height (along the "z" direction) about 4 nm to about 8 nm in some embodiments. The vertical spacing h0 of the gaps 277A (along the "z" direction) between the channel layers 215 may be about 6 nm to about 15 nm in some embodiments. Thus, depending on relative dimensions, the channel layer 215 can be referred to as a "nanowire" or "nanosheet" which generally refers to a channel layer suspended in a manner that will allow a high-k metal gate to physically wrap around the channel layer. In some embodiments, the channel layers 215 may be cylindrical-shaped (e.g., nanowire), rectangular-shaped (e.g., nanobar), sheet-shaped (e.g., nanosheet), or have other suitable shapes.

The device 200 further includes isolation feature(s) 230 to isolate various regions, such as the various active regions 204A and 204B. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures, deep trench isolation (DTI) structures, and/or local oxidation of silicon (LOCOS) structures. Isolation features 230 can include multiple layers of insulating materials.

The device 200 further includes gate spacers 247 adjacent to the S/D features 260. The gate spacers 247 may include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In some embodiments, the gate spacers 247 include a multi-layer structure, such as a first dielectric layer that includes silicon nitride and a second dielectric layer that includes silicon oxide. The device 200 further includes inner spacers 255 vertically between adjacent channel layers 215 and adjacent to the S/D features 260. Inner spacers 255 may include a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, inner spacers 255 include a low-k dielectric material. The gate spacers 247 and the inner spacers 255 are formed by deposition (e.g., CVD, PVD, ALD, etc.) and etching processes (e.g., dry etching). The gate trenches 275 are provided between opposing gate spacers 247 and opposing inner spacers 255 along the "x" direction. Furthermore, the distance between opposing gate spacers 247 of a gate trench 275 has a distance d3 which defines the gate length. In some embodiments, the distance d3 is greater than about 10 nm, for example, about 15 nm to about 50 nm. If the distance d3 is too small, subsequently formed layers (such as sacrificial layers described below) will be difficult to remove and residues thereof may interfere with the anticipated performances. In other words, a larger distance d3 increases the processing window and allows easier material access to inner and deeper areas between and around the channel layers 215. If the distance d3 is too large, it may unnecessarily increase the chip footprint.

The device 200 further includes a contact etch stop layer (CESL) 268 disposed over the isolation features 230, the S/D features 260, and the gate spacers 247. The CESL 268 includes silicon and nitrogen, such as silicon nitride or silicon oxynitride. The CESL 268 may be formed by a deposition process, such as CVD, or other suitable methods. The device 200 further includes an inter-level dielectric (ILD) layer 270 over the CESL 268. The ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. The ILD layer 270 may be formed by a deposition process, such as CVD, flowable CVD (FCVD), or other suitable methods.

The dielectric fins 231 (sometimes interchangeably referred to as the hybrid fins 231) are disposed over the isolation features 230. In the embodiment depicted in FIG. 2C, the dielectric fins 231 include a dielectric liner 232, a dielectric fill layer 233 over the dielectric liner 232, and a dielectric helmet 234 over the dielectric liners 232 and 233. In an embodiment, the dielectric liner 232 includes a low-k dielectric material such as a dielectric material including Si, O, N, and C. Exemplary low-k dielectric materials include FSG, carbon doped silicon oxide, Xerogel, Aerogel, amorphous fluorinated carbon, Parylene, BCB, polyimide, or combinations thereof. Low-k dielectric material generally refers to dielectric materials having a low dielectric constant, for example, lower than that of silicon oxide (k≈3.9). The dielectric liner 232 may be deposited using CVD, PVD, ALD, HDPCVD, MOCVD, RPCVD, PECVD, LPCVD, ALCVD, APCVD, other suitable methods, or combinations thereof. In an embodiment, the dielectric fill layer 233 includes silicon oxide, silicon nitride, silicon oxynitride, TEOS formed oxide, PSG, BPSG, low-k dielectric material, other suitable dielectric material, or combinations thereof. The dielectric fill layer 233 may be deposited using a flowable CVD (FCVD) process that includes, for example, depositing a flowable material (such as a liquid compound) over the device 200 and converting the flowable material to a solid material by a suitable technique, such as thermal annealing and/or ultraviolet radiation treating. The dielectric fill layer 233 may be deposited using other types of methods. In an embodiment, the dielectric helmet 234 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), (Ba, Sr)$TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The dielectric helmet 234 is formed by any of the processes described herein, such as ALD, CVD, PVD, oxidation-based deposition process, other suitable process, or combinations thereof.

The dielectric fins 231 each has a width dimension t0. In some embodiments, the width dimension t0 is about 5 nm to about 30 nm. The dielectric fins 231 dissect portions of the gate structure having different gate materials and isolates adjacent device regions. If the dimension t0 is too small, such as less than about 5 nm, the dielectric fins 231 may be too weak to withstand subsequent processing operations and jeopardize the integrity of the devices they safeguard. Conversely, if the dimension t0 is too large, such as greater than about 30 nm, the cost associated with the valuable chip footprint they occupy overweighs any additional benefit there may be. In some embodiments, the dielectric fin 231 (for example, the dielectric helmet 234) extends over a top surface of the channel layers 215, for example, by a distance H1. In some embodiments, the distance H1 is about 5 nm to about 50 nm. If the distance H1 is too small, such as less than 5 nm, there may not be sufficient error margin that assures proper isolation between adjacent gate portions. Conversely, if the distance H1 is too high, the additional height brings insufficient benefit over their material and processing costs. The gate trenches 275 are provided between opposing dielectric fins 231 along the "y" direction. In some embodiments, adjacent dielectric fins 231 are separated by a distance d0. Accordingly, the gate trenches 275 has a lateral width that equals the distance d0. In some embodiments, the distance d0 is about 20 nm to about 100 nm.

The gate trenches 275 further include gaps 277A between vertically adjacent channel layers 215. The gaps 277A have a vertical dimension h0. In some embodiments, the vertical dimension h0 is about 6 nm to about 15 nm. If the dimension h0 is too small, such as less than about 6 nm, there may be insufficient space to form subsequent layers to form a proper high-k metal gate structure. For example, as described in more detail later, a dipole layer is formed within the gaps 277A. The dipole layer need be sufficiently thick in order to provide sufficient amount of threshold voltage tuning capability. If the dimension h0 is too small, the dipole layer later formed may not satisfy the design needs. Conversely, if the dimension h0 is too large, such as greater than about 15 nm, their additional volumes may not bring benefit substantial enough to justify their chip footprint and/or material and processing costs associated therewith. In some embodiments, an upper limit for the dimension h0 may be back-calculated from the thickness of the dipole layer subsequently formed, as described later.

The gate trenches 275 additionally include gaps 277B between sidewall surfaces of the channel layers 215 and the sidewall surfaces of the dielectric fins 231. The gaps 277B has a lateral width w0. In some embodiments, the lateral width w0 is about 8 nm to about 17 nm. If the distance w0 is too small, such as less than about 8 nm, material access to bottom portions of the gaps 277B and/or to the gaps 277A may be too limited. Conversely, if the dimension w0 is too large, such as greater than about 17 nm, their additional volumes may not bring benefit substantial enough to justify their chip footprint and/or material and processing costs associated therewith. In some embodiments, a difference Δ1 between the lateral width w0 and the distance h0 is at least about 1 nm to about 3 nm. If the difference Δ1 is too small, such as less than about 1 nm to about 3 nm, the subsequently formed layers may merge in the gaps 277B before merging in the gaps 277A. This sometimes cuts off material diffusion pathways into and out from the gaps 277A. Accordingly, subsequently formed electrode layers may not completely fill the gaps 277A and fail to completely surround the channel layers 215. As a result, the gate control of the channel layers 215 may be compromised. In some embodiments, a difference Δ2 between the gate length d3 and the distance h0 is at least about 3 nm to about 5 nm. If the difference 42 is too small, such as less than about 3 nm to about 5 nm, subsequently formed layers may similarly merge across the dimension defined by the inner spacers, and prevent the complete filling of the gaps 277A. As described above, the dimension h0 may be back-calculated from the thickness of the subsequently dipole layer. In some embodiments, the dimension w0 may in turn be calculated from the difference Δ1 and the dimension h0, taking into account the additional factors, such as Δ2.

Figure 3:
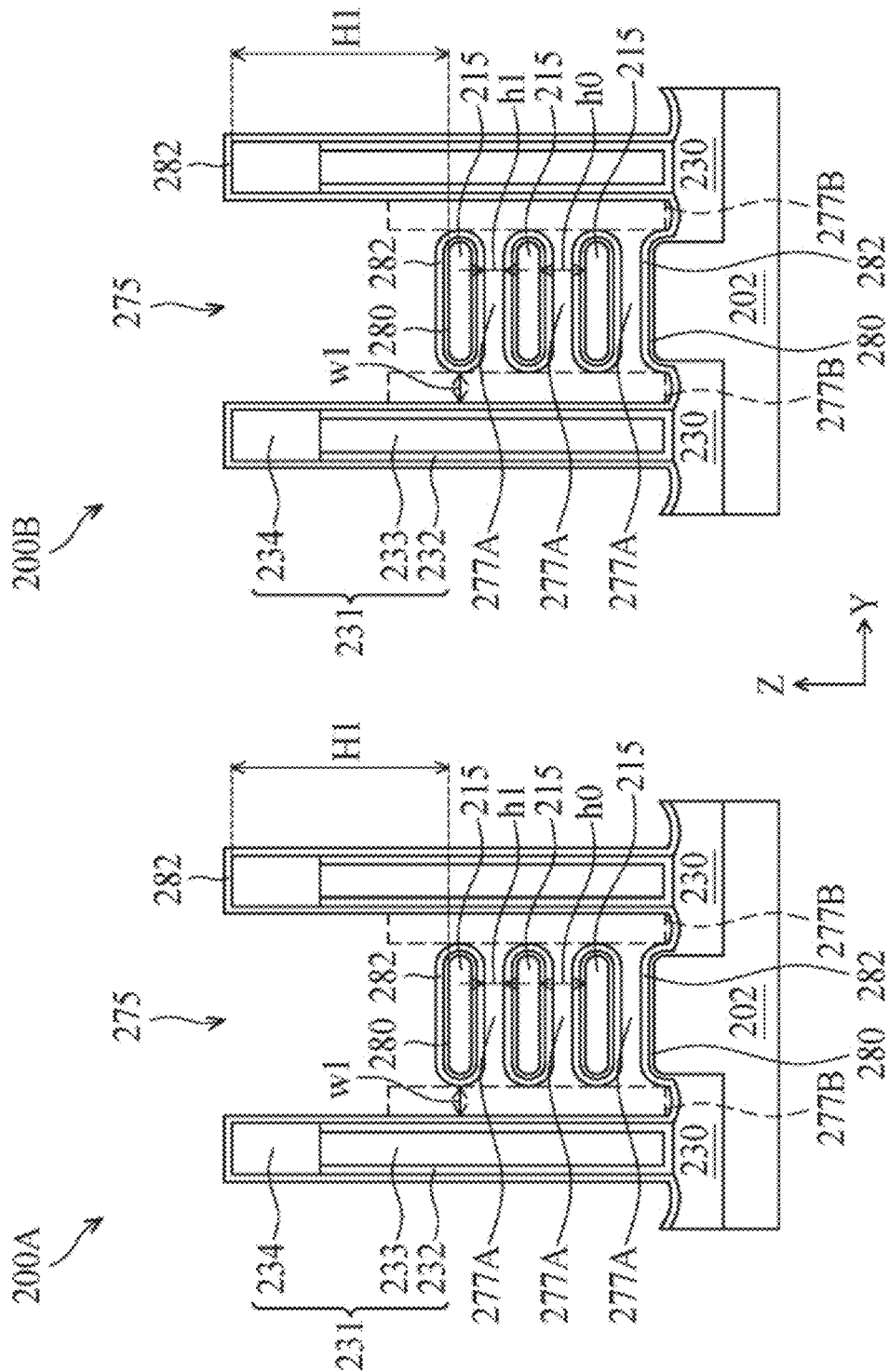

At the operation 104, the method 100 (FIG. 1) forms an interfacial gate dielectric layer (or simply, interfacial layer) 280 on the surfaces of the channel layers 215 that are exposed in the gate trenches 275, such as shown in FIG. 3. FIGS. 3 through 12 illustrate cross-sectional views of the region 200A and 200B at different processing stages and along the A2-A2 line and the B2-B2 line of FIG. 2A, respectively. Turning to FIG. 3, in the depicted embodiment, the interfacial layer 280 wraps around each of the channel layers 215 and partially fills the gaps 277A. In the present embodiment, the interfacial layer 280 is disposed on the semiconductor surfaces exposed in the gate trench 275 such as the surfaces of the channel layers 215 and the substrate 202, but not on the dielectric surfaces exposed in the gate trench 275 (such as the surfaces of the isolation features 230, the gate spacers 247, and the dielectric fins 231). For example, the interfacial layer 280 may be formed by an oxidation process (such as thermal oxidation or chemical oxidation) where the semiconductor surfaces react with oxygen to form a semiconductor oxide as the interfacial layer 280. In such oxidation process, the dielectric surfaces do not react with the oxygen, thus, the interfacial layer 280 is not formed thereon. In an alternative embodiment, the interfacial layer 280 is disposed not only on the channel layers 215 and the substrate 202, but also on the isolation features 230, the gate spacers 247, and the dielectric fins 231, for example, by using atomic layer deposition (ALD) or other suitable deposition methods. The interfacial layer 280 includes a dielectric material, such as $SiO_2$, HfSiO, SiON, other silicon-containing dielectric material, other suitable dielectric material, or combinations thereof. In some embodiments, the interfacial layer 280 has a thickness of about 5 Å to about 15 Å. In some embodiments, the interfacial layer 280 has a thickness of about 9 Å to about 10 Å. If the interfacial layer 280 is too thin, its reliability might be poor in some cases. If the interfacial layer 280 is too thick, the remaining portion of the gaps 277A might be too small to allow for the necessary high-k dielectric layer and metal electrode layer to fill therein in some cases.

Still at the operation 104, the method 100 (FIG. 1) further forms a high-k gate dielectric layer (or simply, high-k dielectric layer) 282 over the interfacial layer 280 and over other structures exposed in the gate trench 275, such as shown in FIG. 3. Still referring to FIG. 3, the high-k gate dielectric layer 282 is disposed over the interfacial layer 280 and wraps around each of the channel layers 215. The high-k gate dielectric layer 282 and the interfacial layer 280 may be collectively referred to as the gate dielectric layers of the device 200. The gate dielectric layers partially fill the gaps 277A. In the present embodiment, the high-k gate dielectric layer 282 is also disposed on the isolation features 230, the gate spacers 247, and the dielectric fins 231. For example, the high-k gate dielectric layer 282 is disposed directly on the isolation features 230, the gate spacers 247, and the dielectric fins 231 in an embodiment. The high-k gate dielectric layer 282 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, ZnO, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), hafnium dioxide-alumina ($HfO_2$—$Al_2O_3$) alloy, other suitable high-k dielectric material, or combinations thereof. The high-k gate dielectric layer 282 is formed by any of the processes described herein, such as ALD, CVD, PVD, oxidation-based deposition process, other suitable process, or combinations thereof. In some embodiments, the high-k gate dielectric layer 282 has a thickness of about 1 nm to about 2 nm. In some embodiments, the high-k gate dielectric layer 282 has a thickness of about 1.2 nm to about 1.4 nm. If the high-k gate dielectric layer 282 has a thickness that is too small, the integrity of the layer may not be guaranteed in all cases; while if the high-k gate dielectric layer 282 has a thickness that is too large, the spacing between the channel layers 215 may be unnecessarily reduced, such that subsequent forming of the electrode layers may encounter challenges. As described in more detail later, another high-k dielectric layer may be subsequently formed over the high-k gate dielectric layer 282. In other words, the high-k gate dielectric layer 282 may be a sublayer of a combined and thicker high-k dielectric layer. Accordingly, the high-k gate dielectric layer 282 may be interchangeably referred to as a high-k gate dielectric sublayer 282.

Following the formation of the interfacial layer 280 and the high-k gate dielectric layer 282 (or high-k gate dielectric sublayer 282), the gaps 277A and 277B are partially filled. There remains a spacing between vertically adjacent channel layers 215, such as between vertically adjacent surfaces of the high-k gate dielectric layer 282. The spacing has a dimension h1 along the z-direction. The dimension h1 is restricted by the dimension h0 and the thickness of the high-k gate dielectric layer 282. In some embodiments, the dimension h1 is about 1 nm to about 10 nm. Moreover, there remains a spacing (having a dimension w1 along the y-direction) between sidewall surfaces of the high-k gate dielectric layer 282 and sidewall surfaces of the dielectric fins 231.

The dimension w1 is restricted by the dimension w0 and the thickness of the high-k gate dielectric layer 282. In some embodiments, the dimension w1 is about 4 nm to about 13 nm.

Figure 4:
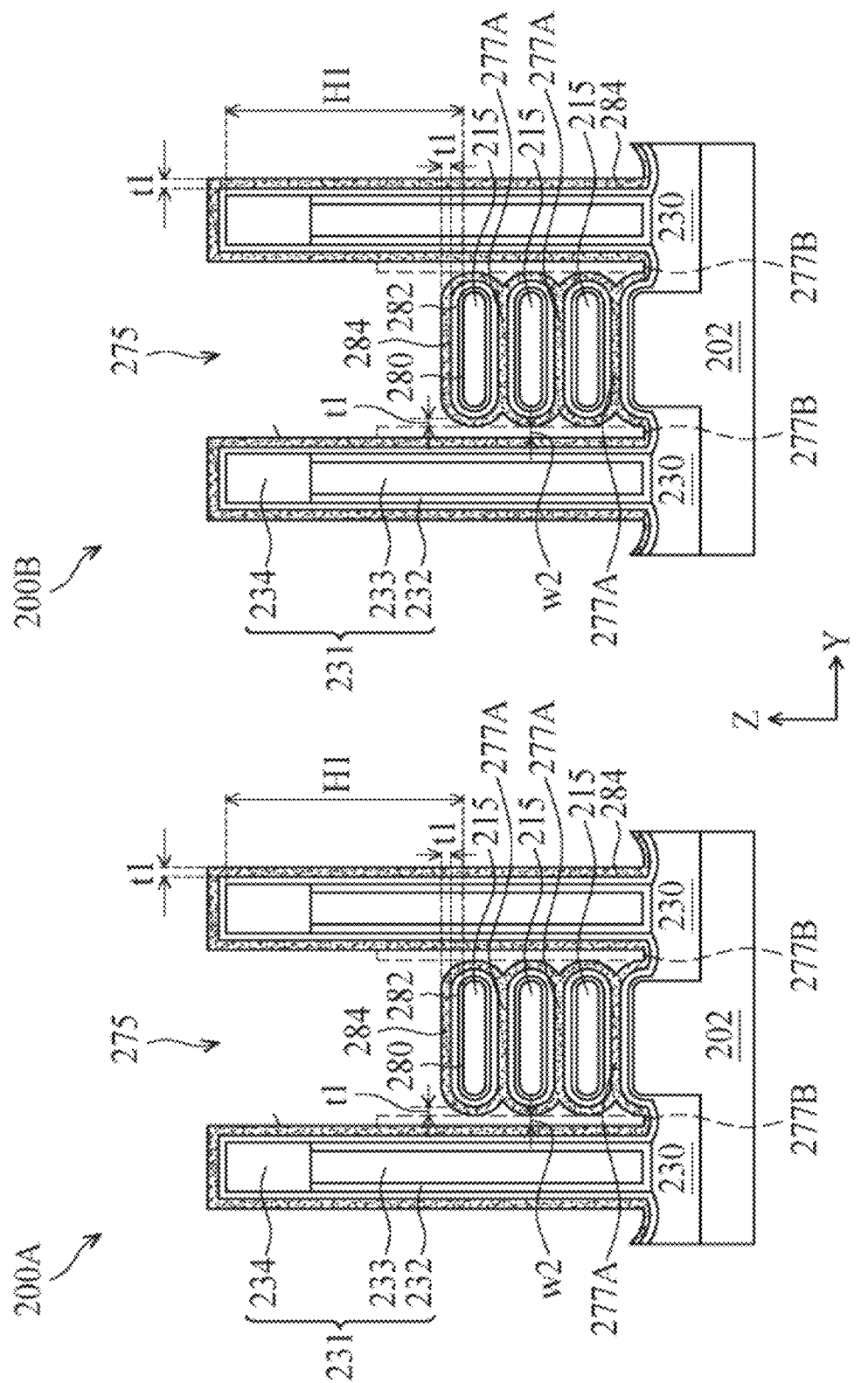
Figure 5:
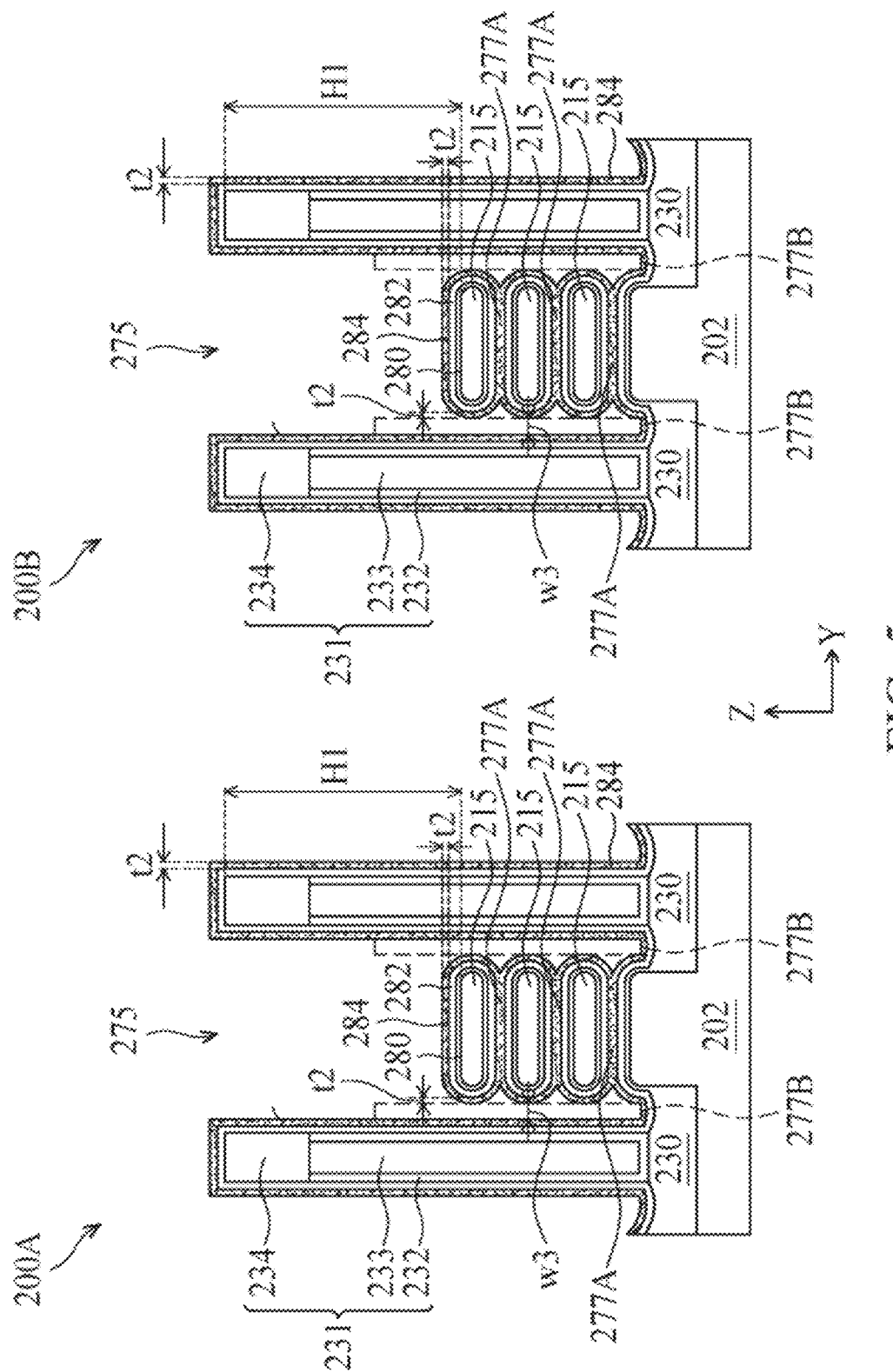

At operation 106, the method 100 (FIG. 1) forms a dipole layer 284 over the high-k gate dielectric layer 282. Referring to FIG. 4, in both the regions 200A and 200B, the dipole layer 284 is deposited over the high-k gate dielectric layer 282 and surrounding each of the channel layers 215. The dipole layer 284 is also disposed over the dielectric fins 231 and the isolation features 230. In some embodiments, the dipole layer 284 includes aluminum oxide. As described in more detail later, aluminum oxide may be a suitable p-type dipole material to adjust threshold voltages of the transistor. However, because of the lack of suitable hard masks to aid in the patterning of aluminum oxide-based dipole layer, applications of aluminum oxide as a p-type dipole material in nanosheet-based devices have been challenging. In some embodiments, the dipole layer 284 may have a thickness dimension t1 throughout its profile. In some embodiments, the thickness dimension t1 is configured to be equal to or greater than half of the distance h1 such that the dipole layer 284 merges between vertically adjacent channel layers 215 (such as between opposing surfaces of the interfacial layer 280). In other words, the gaps 277A are filled with the dipole layer 284. As described in detail later, the merging of the dipole layer 284 enables the dipole layer 284 to function as a hard mask layer in subsequent patterning operations. Accordingly, although the dipole layer 284 has the thickness on outer surfaces (e.g. on top surfaces of the topmost channel layer 215, on sidewall surfaces of all channel layers 215, on sidewall surfaces of the dielectric fins 231, and on top surfaces of the dielectric fins 231), the dipole layer 284 has a thickness between adjacent channel layers 215 that deviates from the thickness t1. In some embodiments, the dipole layer 284 is conformal.

Moreover, in some embodiments, the dimension t1 is configured to be less than half of the dimension w1. Accordingly, there leaves an opening between the channel layers 215 and the dielectric fins 231. For example, as illustrated in FIG. 4, the lateral separation between portions of the dipole layer 284 on the dielectric fins 231 and that on sidewall surfaces of the channel layers 215 is the lateral separation w2. In some embodiments, w2 is configured to be at least 1 nm. If the lateral separation w2 is too small, such as less than 1 nm, etching chemicals required in a subsequent etching operation may not reach the bottom of the gaps 277B. In some embodiments, the thickness dimension t1 of the dipole layer 284 is about 1 nm to about 4 nm. In some embodiments, the thickness dimension t1 of the dipole layer 284 is 1.5 nm to about 2.5 nm. If the dimension t1 is too small, merging between vertically adjacent channel layers 215 may not be accomplished. Moreover, having a relatively large thickness t1 reduces the complexity in controlling the threshold voltages. This aspect is described in more detail later. Conversely, if the dimension t1 is too large, the lateral separation w2 may become too small.

Any suitable methods may be used to form the dipole layer 284. In some embodiments, the dipole layer 284 may be deposited using ALD, CVD, PVD, or other suitable processes. In some embodiments, the deposition may implement a volatile aluminum compound, for example, trimethylaluminum, triisobutylaluminum, tris(dimethylamido)aluminum(III), aluminum tris(2,2,6,6-tetramethyl-3,5-heptanedionate), other suitable aluminum precursors, or combinations thereof. In some embodiments, water, oxygen, plasma, water plasma, other suitable reactants, or combinations thereof may also be implemented. In some embodiments, the deposition of the dipole layer may be conducted at a temperature of about 200° C. to about 400° C. In some embodiments, the control of the thickness t1 may be achieved by controlling the number of cycles of the deposition operation. In some embodiments, the number of ALD cycles may be greater than 15 cycles. If the number of deposition cycles is too small, the thickness t1 may not be optimized (as described above).

At operation 108, the method 100 (FIG. 1) proceeds to recess the dipole layer 284 (FIG. 5), such that portions of the dipole layer 284 on sidewall surfaces of the channel layer 215, as well as portions on the sidewall surfaces of the dielectric fins 231 are recessed. Accordingly, the thickness of these portions of the dipole layer 284 is reduced from t1 to t2, and the lateral dimension of the gaps 277B is widened from w2 to w3. Additionally, the dipole layer 284 on top surfaces of the stack of channel layers 215 is also reduced from t1 to t2. In some embodiments, the thickness t2 is about 1.5 nm to about 2 nm. In some embodiments, the remaining portions of the dipole layer 284 protects the high-k gate dielectric layer 282 in a subsequent etching operation. If the thickness t2 is too small, such as less than about 1.5 nm, any irregularity may cause damages to the high-k gate dielectric layer 282 in such etching operation; conversely, if the thickness t2 is too large, such as greater than about 2 nm, the lateral separation w3 may be too small. For example, in some embodiments, the lateral separation w3 may be at least about 2 nm. If the thickness t2 is too large, or if the lateral separation w2 is too small, such as less than 2 nm, subsequent deposition of materials may not reach the bottom of the gaps 277B, such that defects and voids may be formed therein, which in turn, adversely affects subsequent processing.

Any suitable etching methods and etching chemicals may be implemented to recess the dipole layer 284. In some embodiments, the recessing operation may be a wet etching operation, and may implement a wet etching chemical, such as ammonium hydroxide. Alternatively, the etching operation may implement a wet etching chemical selected from tetramethyl ammonium hydroxide, tetraethylammonium hydroxide, tetra-n-butylammonium hydroxide, ammonium fluoride, tetrabutylammonium fluoride, other suitable etching chemicals, or combinations thereof. Accordingly, the outer surfaces of the dipole layer 284 may be recessed. For example, the dipole layer 284 on sidewall surfaces of the dielectric fins 231, on top surfaces of the topmost channel layers 215, and on sidewall surfaces of the channel layers 215 are recessed. However, the dipole layer 284 between vertically adjacent channel layers 215 are not substantially recessed beyond the outmost edges, for example, because any contact of the dipole layer 284 with the wet etching chemicals during the operation are limited to the surface. Accordingly, the entire gaps 277A remain filled with the dipole layer 284, and the outer surfaces of the stack of channel layers 215 remain covered by the dipole layer 284. Accordingly, the dipole layer 284 may serve as a hard mask layer in a subsequent patterning operation.

Figure 6:
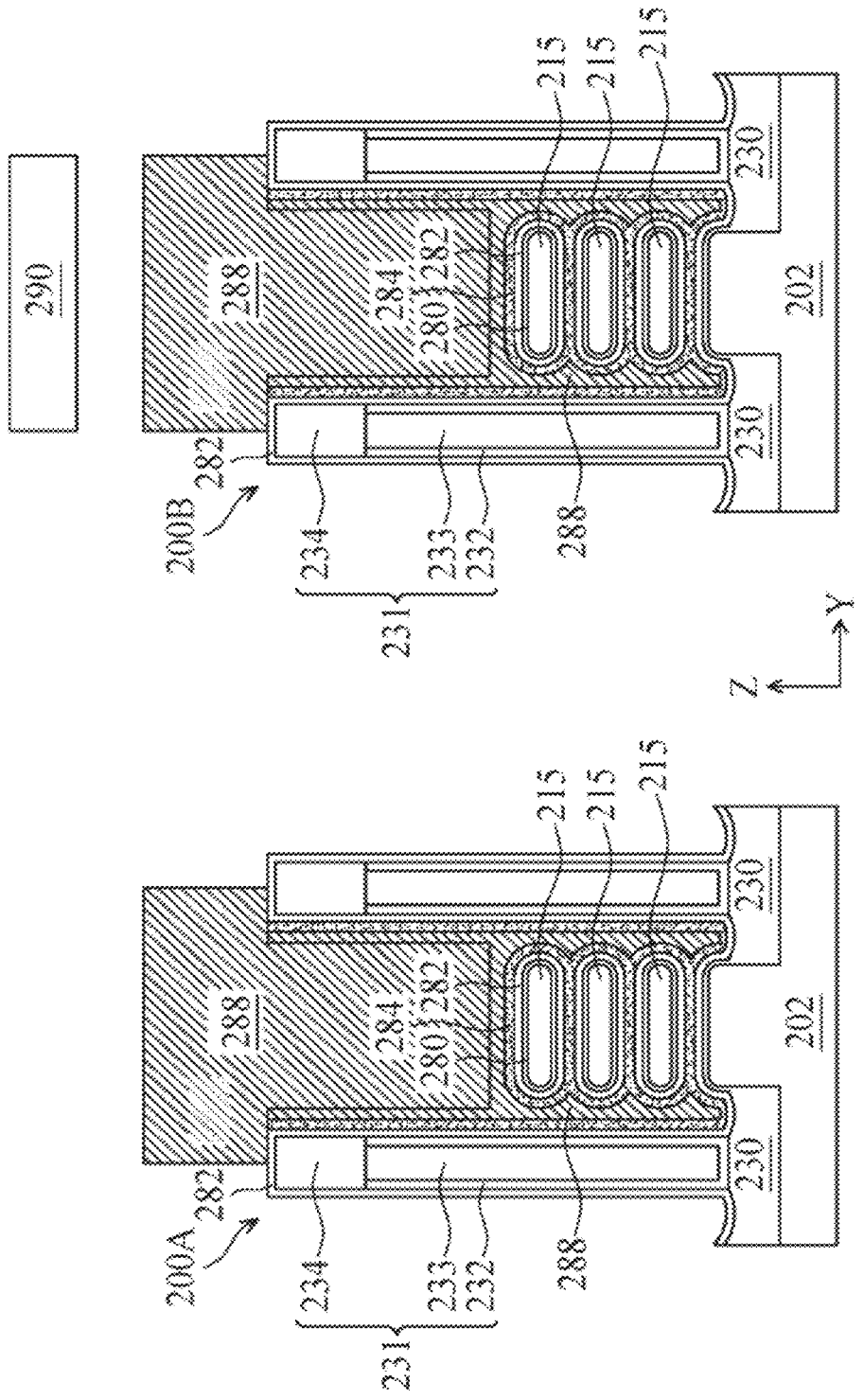

At operation 110, the method 100 (FIG. 1) proceeds to form a dielectric layer 288 in the gate trenches 275 (FIG. 6). As illustrated, the dielectric layer 288 also fills the gaps 277B (compare FIG. 5). In some embodiments, the dielectric layer 288 includes a bottom anti-reflective coating (BARC) material. The dielectric layer 288 serves to protect the channel layers 215, as well as various layers formed thereon from subsequent etching reaction. In an embodiment, the dielectric layer 288 is formed by spin coating a BARC material over the device 200 and filling the gate trenches 275. In some embodiments, the BARC material is baked (for example, at a temperature in a range about 100° C. to about 200° C.) to cause cross-linking within the BARC material. In some embodiments, the dielectric layer 288 has a top surface that extends over a top surface of the dielectric fins 231 (including layers formed thereon).

Figure 7:
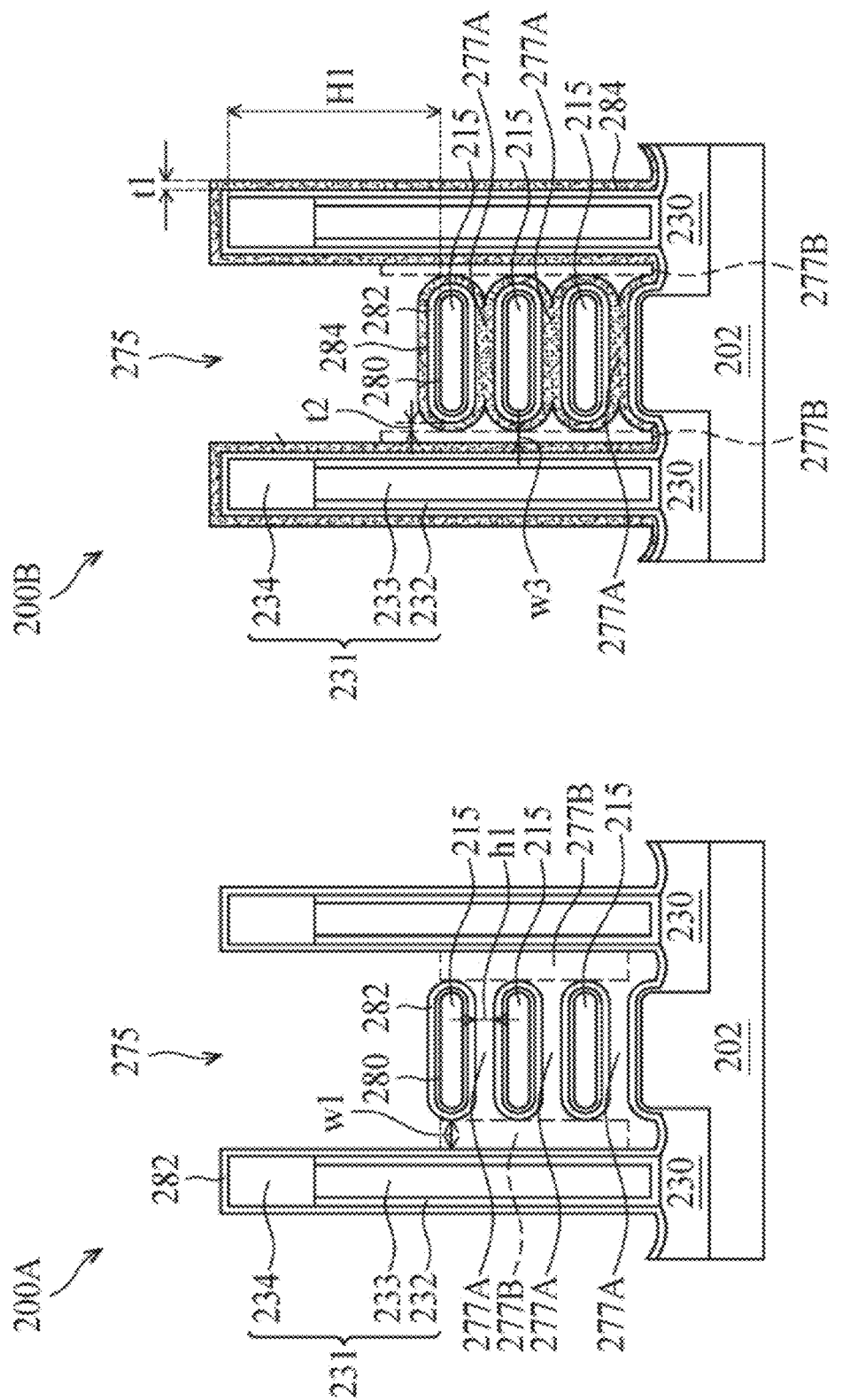

A patterned photoresist 290 is formed to cover the region 200B while leaving the region 200A exposed. At operation 112, the method 100 (FIG. 1) proceeds to remove the dipole layer 284 in the region 200A (FIG. 7). For example, the pattern of the patterned photoresist 290 may be transferred to the dielectric layer 288 using an anisotropic etching operation. In some embodiments, the etching operation implements a dry etching process, such as a plasma etching process, a reactive-ion etching process, another suitable dry etching method, or combinations thereof. Accordingly, at the conclusion of the dry etching process, the region 200A is exposed while the region 200B remain covered by the dielectric layer 288. Thereafter, in some embodiments, a wet etching process is implemented to remove the dipole layer 284 now exposed in the region 200A. The wet etching process may be similar to those already described with respect to FIG. 5. For example, the wet etching process may implement ammonium hydroxide. Alternatively, the wet etching process may implement tetramethyl ammonium hydroxide, tetraethylammonium hydroxide, tetra-n-butylammonium hydroxide, ammonium fluoride, tetrabutylammonium fluoride, other suitable etching chemicals, or combinations thereof. At the conclusion of the wet etching process, gate trench 275 in the region 200A is restored, along with the gaps 277A and 277B, to their respective dimensions at the processing stage of FIG. 3. For example, the gaps 277A each have a height dimension hl (as in FIG. 3); and the gaps 277B each have a width dimension w1 (as in FIG. 3). In some embodiments, the wet etching operation is configured to remove the dipole layer 284 in the device region in its entirety. Accordingly, no dipole layer 284 remains in these openings; and the high-k gate dielectric layer 282 is once again exposed in the gate trenches 275 of the region 200A. Meanwhile, the dipole layer 284 and high-k gate dielectric layer 282 remain unchanged in the region 200B, as compared to the processing stage of FIG. 6. Thereafter, the dielectric layer 288 is removed using any suitable methods. In some embodiments, the removal of the dielectric layer 288 may implement an ashing operation at a temperature of about 100° C. to about 300° C. In the temperature is too low, such as less than about 100° C., residues from the dielectric layer 288 may remain and cause issues in subsequent depositions; while if the temperature is too high, such as greater than about 300° C., any benefit may be outweighed by the processing costs.

Accordingly, at this processing stage, the dipole layer 284 is effectively patterned, such that the dipole layer 284 is present in region 200B but not in region 200A. In some other approaches not implementing methods described herein, for example, where the dipole layer 284 did not merge and fill the gaps 277A at the processing stage of FIG. 4, the dielectric layer 288 may penetrate into areas between the vertically adjacent channel layers 215. Due to the lack of processing window, subsequent removal of that portion of the dielectric layer 288 may be challenging. Accordingly, defects may form which lead to degraded device characteristics. In other words, without implementing the methods described here, the lack of suitable hard mask material to pattern aluminum oxide precludes its use as a dipole material and thereby substantially limits the scope of offering with respect to p-type dipoles.

Figure 8:
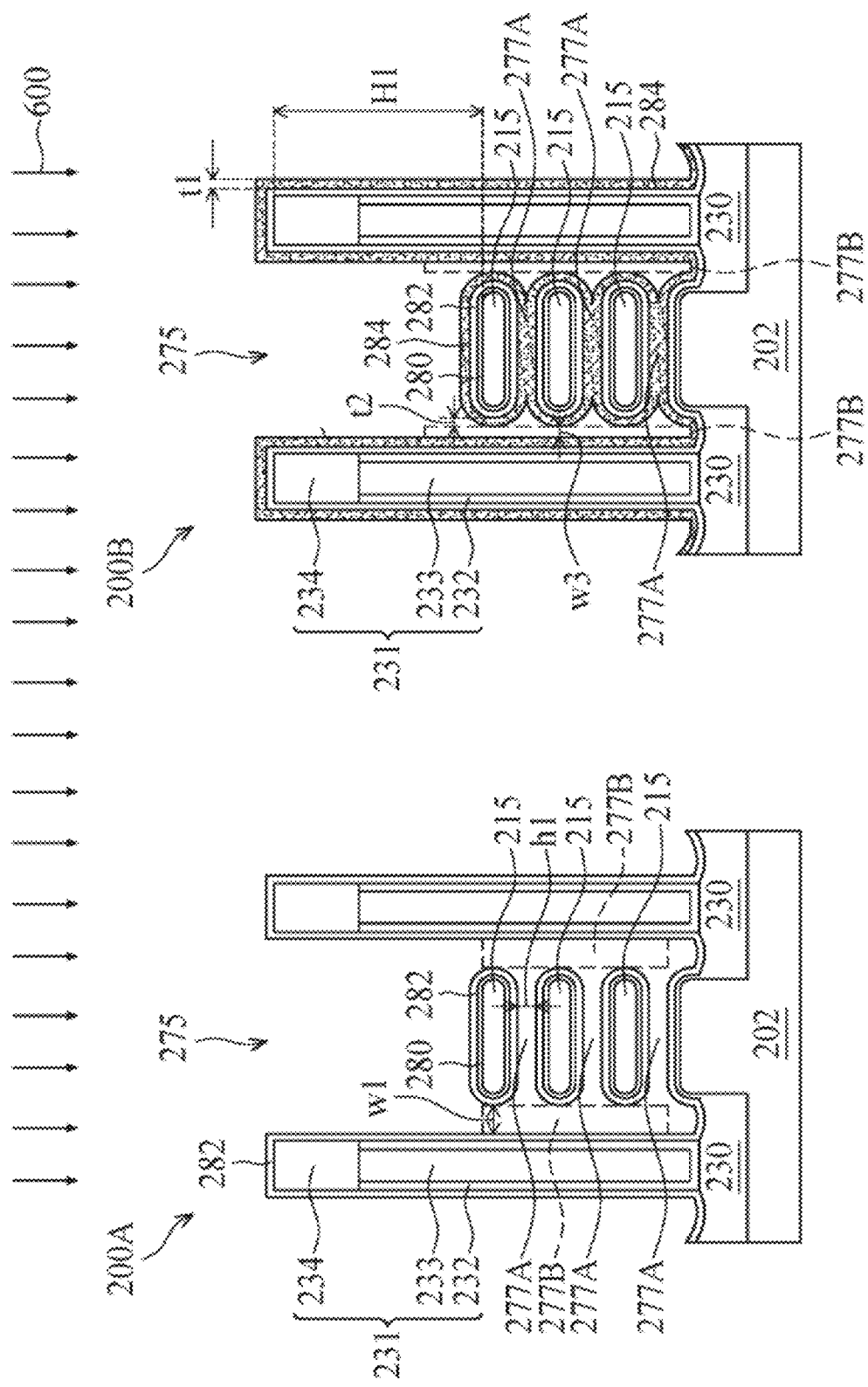

At operation 114, the method 100 (FIG. 1) proceeds to conduct a thermal treatment process 600 (or annealing process 600) (FIG. 8). The thermal treatment process 600 provides thermal energy required for the elements of the dipole layer 284 to migrate into the high-k gate dielectric layer 282 with which it interfaces. Accordingly, portions of the high-k gate dielectric layer 282 (e.g. the portion in region 200B) includes the dipole material from the dipole layer 284 (such as aluminum oxides). Moreover, the thermal treatment process 600 further drives the dipole material across the high-k gate dielectric layer 282 towards the interface between the high-k gate dielectric layer 282 and the interfacial layer 280. It has been discovered that the relative magnitudes of the oxygen areal density a between the dipole material and the material of the interfacial layer 280 determines the direction and magnitude of the dipole so created. In the depicted embodiments, the dipole material here includes aluminum oxide, while the interfacial layer here includes silicon oxide. Aluminum oxide includes a higher oxygen areal density than silicon oxide. Accordingly, the thermal treatment process drives the oxygen atoms, which carry negative charges, into the interfacial layer 280. Accordingly, a net positive charge remains within the high-k gate dielectric layer 282, and a dipole pointing (from the positive pole to the negative pole) is created across the interface between the high-k gate dielectric layer 282 and the interfacial layer 280. As compared to other dipole materials, aluminum oxide may provide larger dipoles thereby better efficacy in adjusting the threshold voltages. Moreover, it has been discovered that the aluminum atoms diffused into the high-k gate dielectric layer 282 are well confined within the boundaries of the high-k gate dielectric layer 282, as described in more detail with respect to FIG. 19C. Accordingly, minimal aluminum (if any) diffuses towards the channel layer 215 to cause breakthrough concerns.

Figure 9:
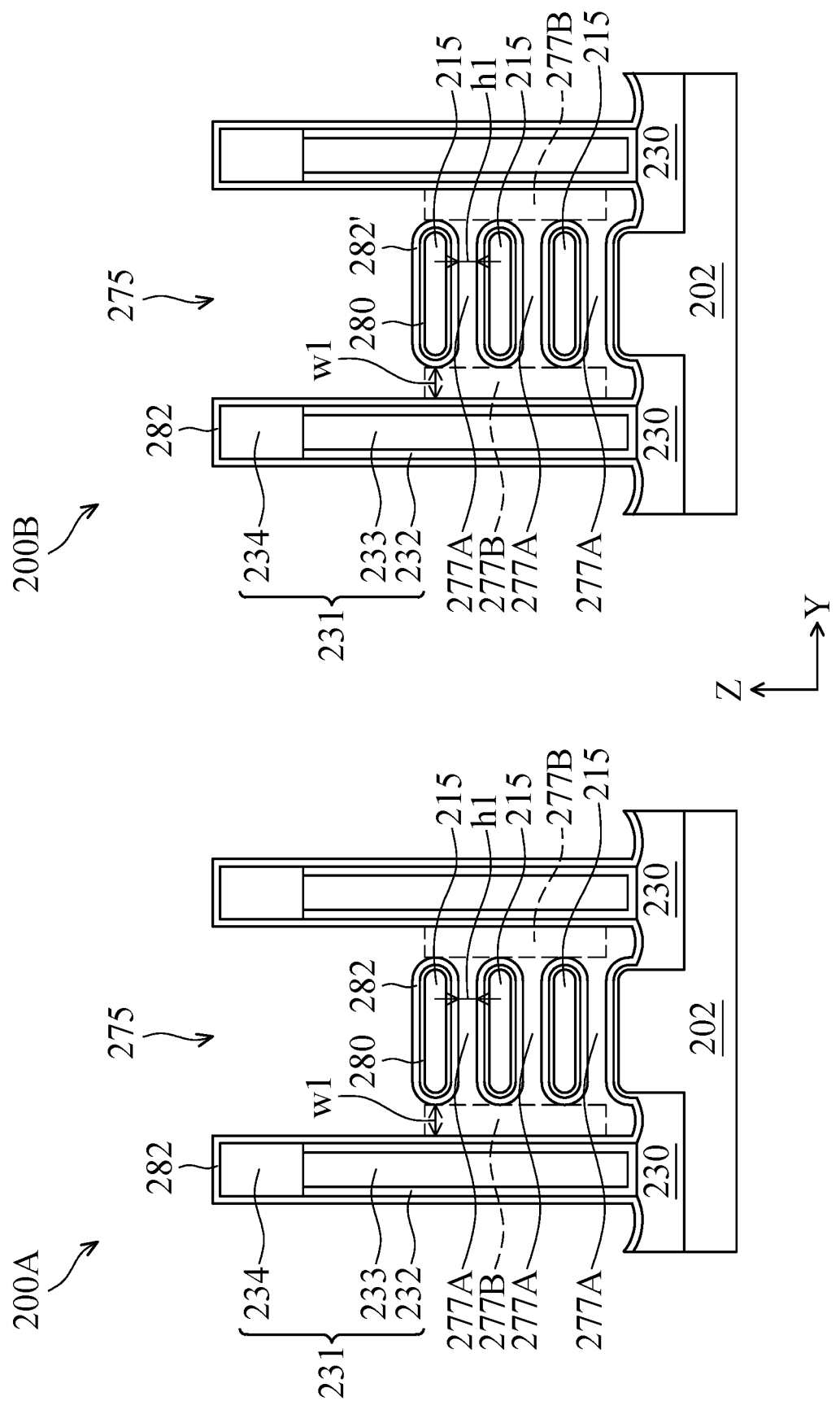

Any suitable methods may be implemented for the thermal treatment process 600. For example, the thermal treatment process 600 may implement a soak annealing, a spike annealing, a laser annealing, other treatment method, or combinations thereof. In some embodiments, the thermal treatment process 600 implements a temperature of about 850° C. to about 900° C. If the temperature is too low, the dipole migration may be too inefficient; while if the temperature is too high, the migration may be hard to control. Referring to FIG. 9, at the conclusion of the thermal treatment process 600, the high-k gate dielectric layer 282 in the region 200B includes the dipole material from the dipole layer 284 (e.g. aluminum oxide), and is therefore referred to as the modified high-k gate dielectric layer 282'. Meanwhile, the high-k gate dielectric layer 282 in the region 200A is unmodified because of the lack of dipole material thereon during the thermal treatment process 600. Thereafter, at operation 116 (FIG. 1), the method 100 proceeds to remove any remaining portions of the dipole layer 284 still on surfaces of the modified high-k gate dielectric layer 282' in the region 200B. In some embodiments, the removal of the remaining portions of the dipole layer 284 may implement a wet etching chemical similar to those described above with respect to operations 108 and/or 112. Accordingly, at this processing stage, the gaps 277A between vertically adjacent channel layers 215 are reformed in the region 200B; and the gaps 277B between sidewall surfaces of the channel layer 215 and the sidewall surface of the dielectric fin are also reformed in the region 200B. In some embodiments, the dimensions of the gaps 277A and 277B are restored to values similar to that of FIG. 3. In other words, at this processing stage, the gaps 277A in both regions 200A and 200B may have a height dimension h1; and the gaps 277B in both regions 200A and 200B may have a lateral dimension w1.

Figure 10:
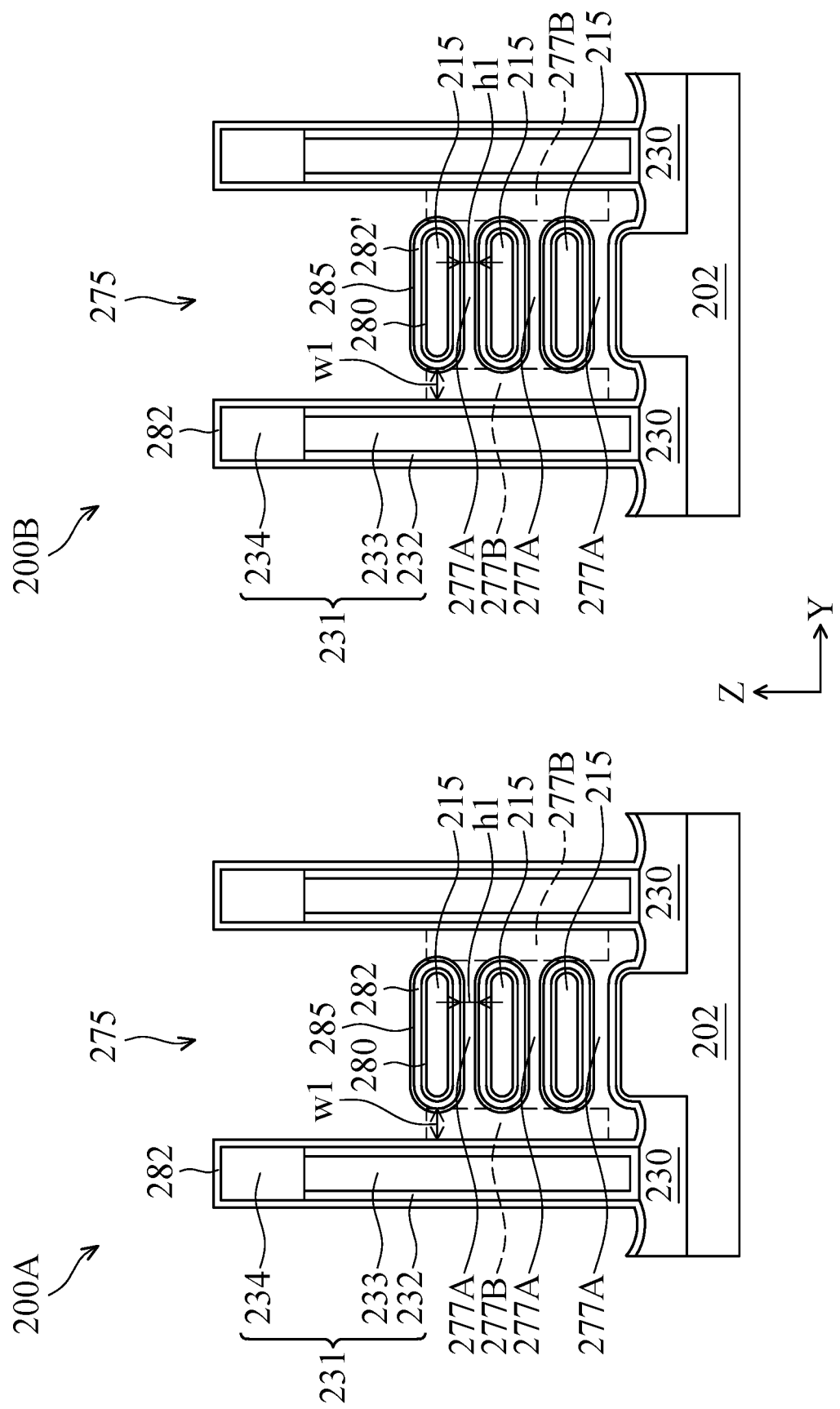

In some embodiments, referring to path A1 of FIG. 1, the method 100 proceeds to conduct operation 118 to form another high-k gate dielectric layer 285 around the unmodified high-k gate dielectric layer 282 in the region 200A and around the modified high-k gate dielectric layer 282' in the region 200B (FIG. 10). Accordingly, the dipole materials within the modified high-k gate dielectric layer 282' are confined (and sandwiched) between two layers of the high-k gate dielectric layers 282' and 285. In some embodiments, the high-k gate dielectric layer 285 simply serves to confine any out-diffusion of the dipole elements. In such embodiments, the high-k gate dielectric layer 285 may include a suitable high-k dielectric material (e.g. hafnium oxide) and may have a thickness of about 0.3 nm to about 0.4 nm. In some other embodiments, the high-k gate dielectric layer 285 may be processed similar to that of the high-k gate dielectric layer 282. In other words, portions of the high-k gate dielectric layer 285 may be modified with a dipole material. In some embodiments, the portion (and only portion) of the high-k gate dielectric layer 285 that is modified overlays the high-k gate dielectric layer 282' in the region 200B. Accordingly, the high-k gate dielectric layer 282/282' and the high-k dielectric layer 285 may be considered to be similar sublayers of an otherwise contiguous high-k dielectric layer. In such embodiments, the high-k gate dielectric layer 285 may have a thickness similar to that of the high-k gate dielectric layer 282 as described above. In some embodiments, however, the formation of the high-k gate dielectric layer 285 is omitted.

Figure 11:
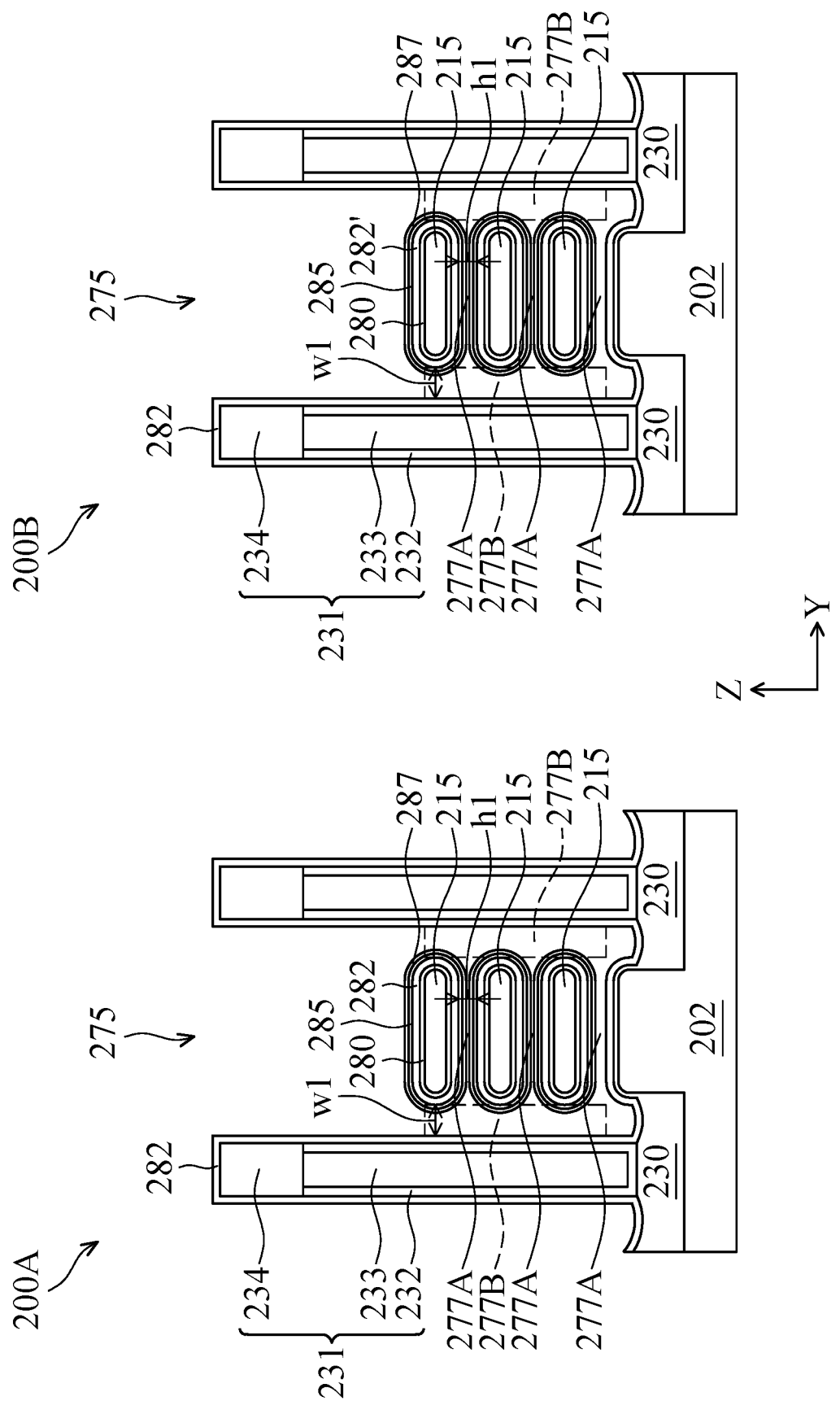
Figure 12:
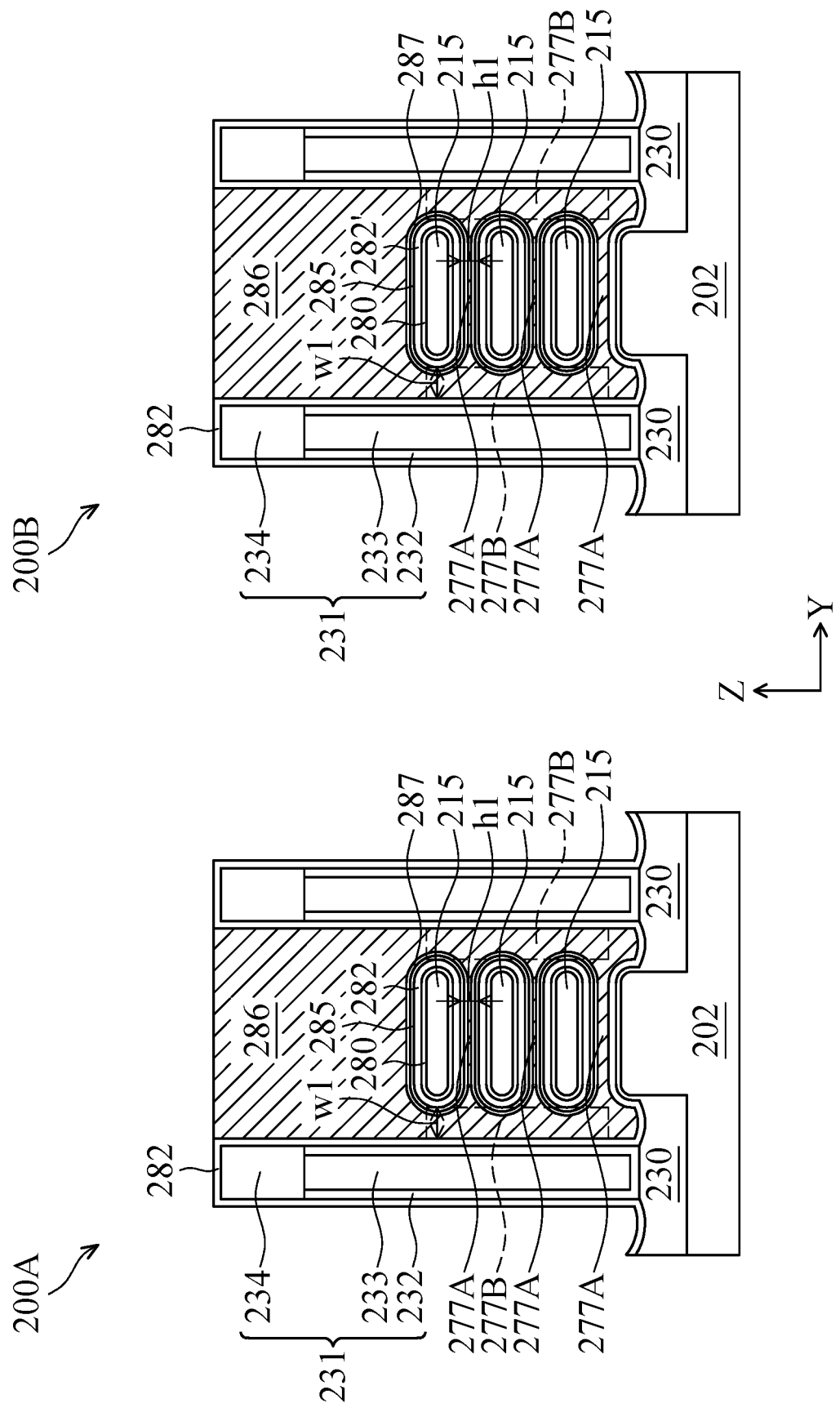

Then, a capping layer 287 is formed to cover the high-k dielectric layers 282/282' (and the high-k dielectric layer 285, if present) (FIG. 11). In some embodiments, the capping layer includes titanium nitride, tantalum nitride, other suitable capping materials, or combinations thereof. Thereafter, the method 100 proceeds to conduct operation 120 of FIG. 1 to form gate electrode layers 286 surrounding the high-k gate dielectric layers (FIG. 12). In some embodiments, the gate electrode layer 286 may include a p-type work function metal TiN, TaN, TaSN, TiSiN, Ru, Mo, Al, WN, WCN ZrSi$_2$, MoSi$_2$, TaSi$_2$, NiSi$_2$, other p-type work function material, or combinations thereof. In some embodiments, the gate electrode layer 286 may include an n-type work function metal, such as Ti, Al, Ag, Mn, Zr, TiC, TiAl, TiAlC, TiAlSiC, TiAlN, TaC, TaCN, TaSiN, TaAl, TaAlC, TaSiAlC, TiAlN, other n-type work function material, or combinations thereof. In some embodiments, the gate electrode layer 286 in the region 200A may be the same as the gate electrode layer 286 in the region 200B. In other embodiments, the gate electrode layer 286 in the region 200A may be different from the gate electrode layer 286 in the region 200B. Further, the gate electrode layer 286 may further include bulk metal materials, such as copper, tungsten, or other suitable metal materials. The bulk metal material may additionally include other metals, metal oxides, metal nitrides, other suitable materials, or combinations thereof. In some embodiments, a CMP process is performed to planarize the top surface of the device 200.

Figure 13:
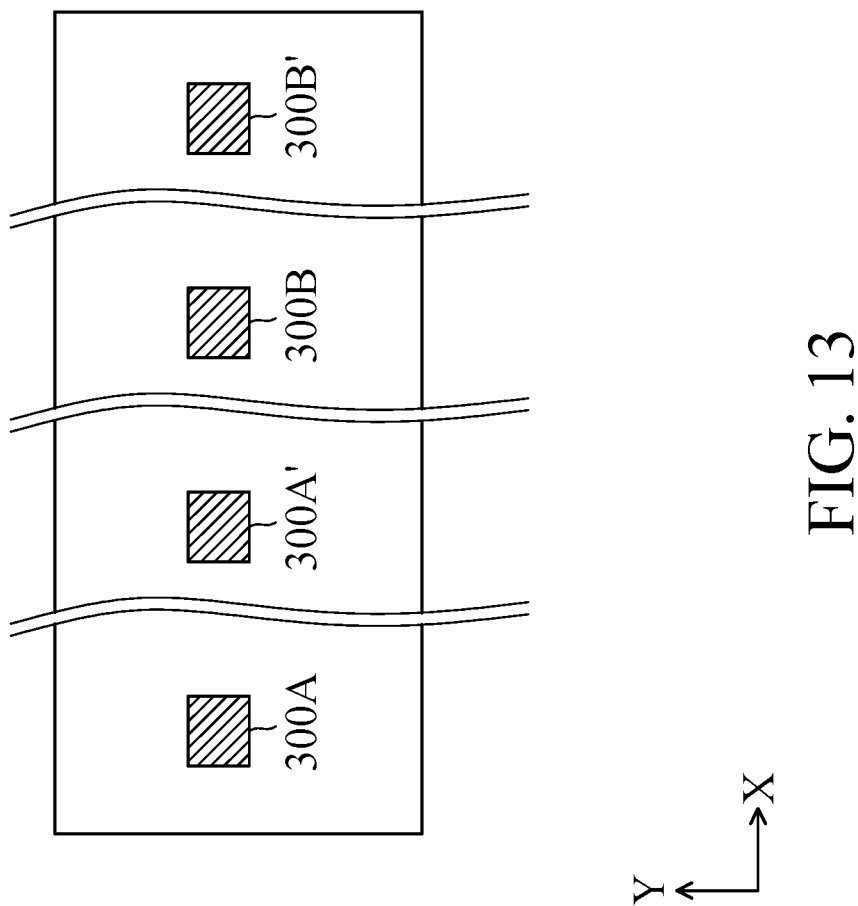

Alternatively or additionally, referring back to the path A2 of FIG. 1, the method 100 may proceed to repeat the operations 106-116 prior to the operation 118. This is further illustrated in FIG. 13. FIG. 13 illustrates regions 300A, 300A', 300B, and 300B', where the regions 300A and 300A' have both undergone processing identical to those described above with respect to region 200A. Accordingly, the regions 300A and 300A' both include device features identical to that of 200A of FIG. 9. Moreover, the regions 300B and 300B' have both undergone processing identical to those described above with respect to region 200B. Accordingly, the regions 300B and 300B' both include device features identical to that of 200B of FIG. 9. In a second cycle of the operations 106-116, the mask layer of operation 110 is configured to be offset from those in the first cycle. For example, in the second cycle of operations 106-116, another dipole layer 284' (which may also be a layer of aluminum oxide of a same or different thickness as that of the dipole layer 284) is formed on the regions 300A, 300A', 300B, and 300B'. The dipole layer 284' may be similarly recessed to provide improved processing window. In the second operation 110, the mask layer is formed to cover the regions 300A' and 300B' while leaving the regions 300A and 300B exposed (as compared to covering regions 300B and 300B' in the first operation 110). Accordingly, subsequent processing operations remove the dipole layer 284' from the regions 300A and 300B while keeping the dipole layer 284' in the regions 300A' and 300B'. After the completion of the second operations 114 and 116, the region 300A includes no dipole materials from the dipole layer 284, and include no dipole materials from the dipole layer 284'; the region 300A' includes no dipole material from the dipole layer 284, but includes dipole material from the dipole layer 284'; the region 300B includes dipole materials from the dipole layer 284, but includes no dipole materials from the dipole layer 284'; the region 300B' includes dipole material from the dipole layer 284, and includes dipole material from the dipole layer 284'. Therefore, up to four different dipole configurations may be achieved across the regions 300A, 300A', 300B, and 300B'. Following the subsequent processing to complete the fabrication of transistors, transistors with up to four different Vt may be achieved. Of course, the same or similar further processing may be further implemented to provide even more offerings of different threshold voltages.

Without being limited by theory, the threshold voltage of a transistor is affected by the concentration of dipole material (e.g. aluminum oxide) within the high-k gate dielectric layer 282 (e.g. having hafnium dioxide). For example, the change in flat band voltage ($\Delta V_{fb}$) linearly scales with the ratio of aluminum concentration to hafnium concentration. In some embodiments, the concentration of the dipole material is affected by the temperature used in the thermal treatment process 600, as well as by the thickness of the dipole layer 284 interfacing with the high-k gate dielectric layer 282 prior to the thermal treatment process 600. FIG. 19A illustrates an example relationship between the change in the flat band voltage ($\Delta V_{fb}$) and the temperature of the thermal treatment operation, as well as between the change in capacitance-equivalent thickness ($\Delta$CET) and the temperature of thermal treatment operation. For example, at an annealing temperature T1 of about 730° C. to about 770° C., the threshold voltage of a p-type transistor is reduced by about 15 mV to about 20 mV. Meanwhile, the $\Delta$CET is adjusted by about 0.2 Å to about 0.3 Å thickness. For example, at an annealing temperature T2 of about 830° C. to about 870° C., the threshold voltage of a p-type transistor is reduced by about 35 mV to about 40 mV. Meanwhile, the $\Delta$CET is adjusted by about 0.4 Å to about 0.5 Å thickness. For example, at an annealing temperature T3 of about 880° C. to about 920° C., the threshold voltage of a p-type transistor is reduced by about 75 mV to about 85 mV. Meanwhile, the $\Delta$CET is adjusted by about 0.65 Å about 0.75 Å thickness. In some embodiments, the annealing operation may be a single-step annealing operation. Alternative, the annealing operation may be a multi-step annealing operation where each of the steps may be conducted at the same or different annealing temperatures. In some embodiments, the $\Delta V_{fb}$ is further affected by the time duration for the annealing operations. Generally, a longer time duration causes more dipole materials to migrate into the high-k gate dielectric layer 282. In some embodiments, the time duration may be about 1 second to about 1 hour. In some embodiments, the time duration may be about 10 seconds to about 60 seconds. If the time duration is too short, there may be insufficient amount of dipole material that migrate into the high-k gate dielectric layer 282. If the time duration is too long, any additional benefit may be offset by the additional cost. In some embodiments, the time duration may be adjusted within these ranges in order to adjust the amount of dipole material that migrate into the high-k gate dielectric layer 282. For example, a longer time duration generally leads to larger amount of the dipole material to migrate into the high-k gate dielectric layer 282, and a shorter time duration generally leads to a smaller amount of the dipole material to migrate into the high-k gate dielectric layer 282.

Figure 19B:
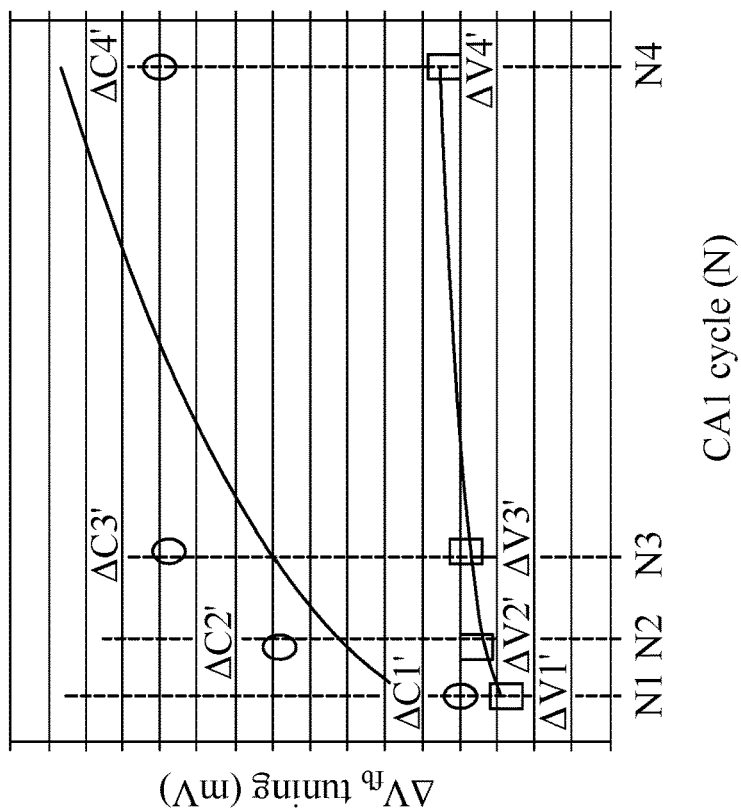
FIGS. 19A and 19B illustrate relationship between threshold voltage tuning capability with certain processing parameters.
Figure 19A:
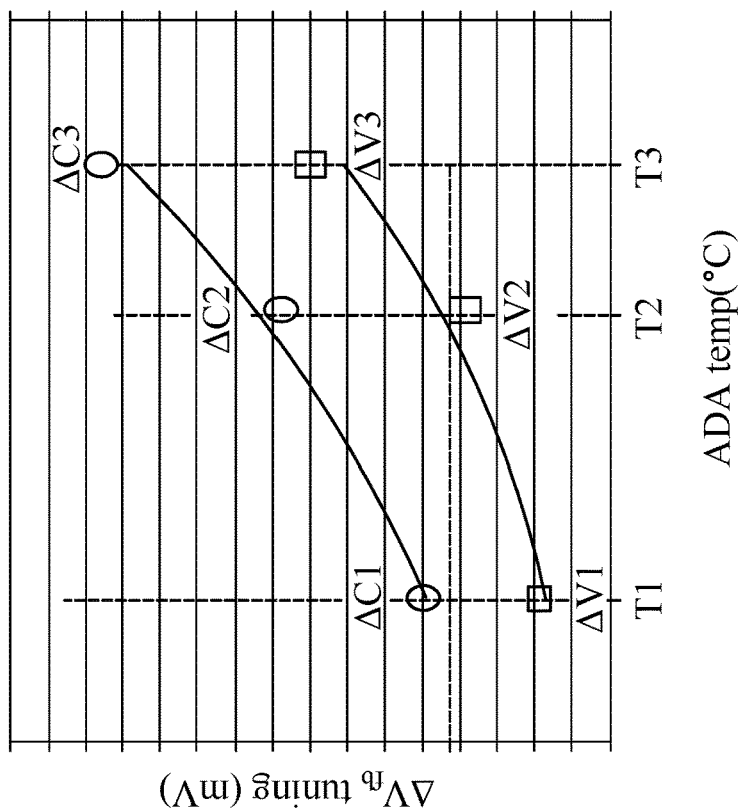

FIG. 19B illustrates an example relationship between the number of deposit cycles for the dipole layer 284 and the change in the flat band voltage ($\Delta V_{fb}$), as well as between the number of deposit cycles for the dipole layer 284 and the change in capacitance-equivalent thickness ($\Delta$CET). As illustrated, at a deposition cycle of about 1 to about 3, the $\Delta V_{fb}$ is adjusted by about 25 mV to about 30 mV. Meanwhile, the $\Delta$CET is adjusted by about 0.1 to about 0.2. At a deposition cycle of about 3 to about 5, the $\Delta V_{fb}$ is adjusted by about 32 mV to about 37 mV. Meanwhile, the $\Delta$CET is adjusted by about 0.3 to about 0.4. At a deposition cycle of about 7 to about 9, the $\Delta V_{fb}$ is adjusted by about 35 mV to about 40 mV. Meanwhile, the $\Delta$CET is adjusted by about 0.4 to about 0.5. At a deposition cycle of about 25 to about 30, the $\Delta V_{fb}$ is adjusted by about 40 mV to about 45 mV. Meanwhile, the $\Delta$CET is adjusted by about 0.4 to about 0.5. Accordingly, as illustrated in FIG. 19B, while the number of deposition cycles initially significantly affect the threshold voltage tuning, its effect rapidly saturated. When the number of cycle exceeds about 15 cycles, any change in the $\Delta V_{fb}$ or in $\Delta$CET becomes negligible. In some embodiments, the deposition of the dipole layer 284 is configured to implement a cycle number that exceeds 15. Accordingly, the annealing temperature substantially determines the $\Delta V_{fb}$ or in $\Delta$CET. This substantially simplifies the design of multi-Vt devices. In other words, with the thickness of the dipole layer 284 exceeding the saturation level, the threshold voltage may be adjusted by tuning the annealing temperature of the thermal treatment processes (e.g. processes 600). As described above, in some embodiments, the annealing temperatures are about 850° C. to about 900° C. to provide a threshold voltage of about 40 mV to about 80 mV. It is noted that a different annealing temperature may be implemented if the target threshold voltage tuning magnitude is different, for example, by referencing FIG. 19A.

Figure 19C:
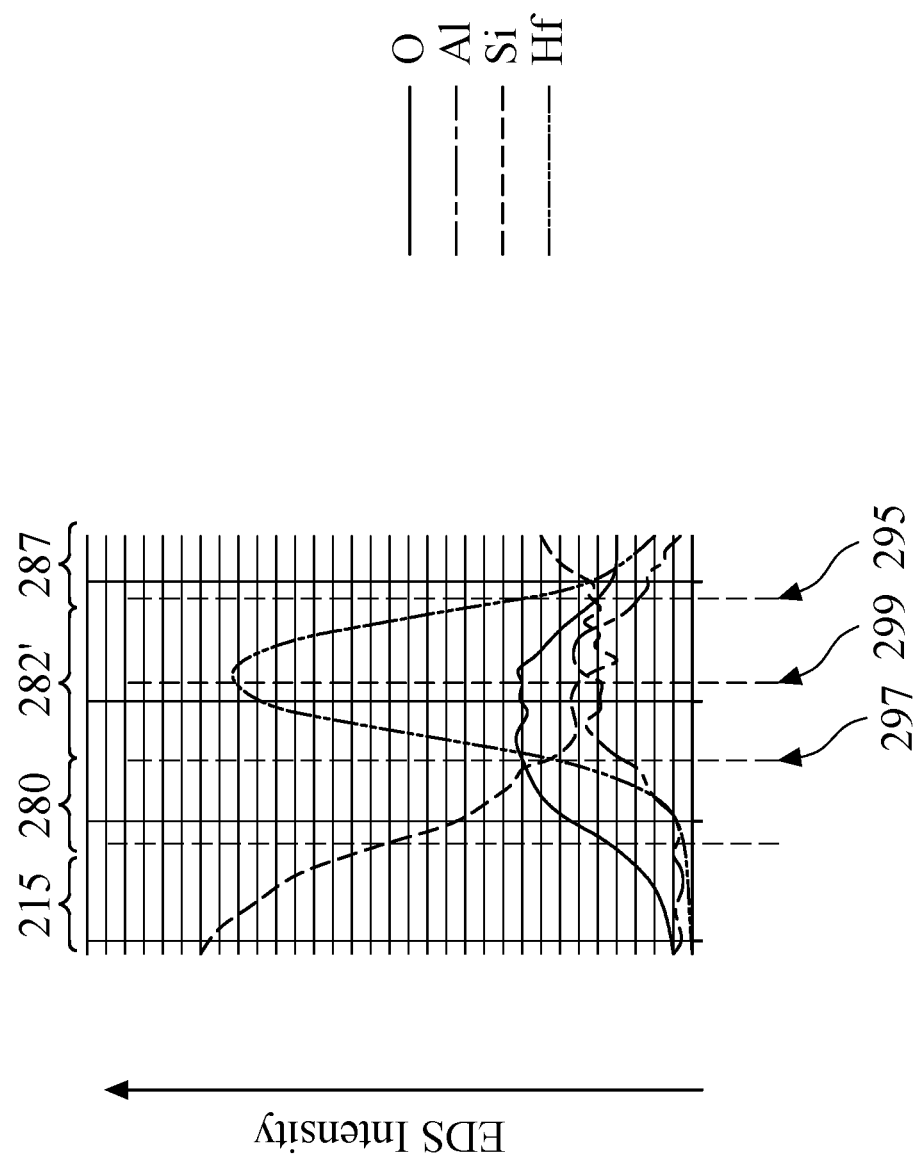
FIG. 19C illustrates elemental distributions within certain layers of a semiconductor device according to an embodiment of the present disclosure.

Accordingly, the concentration of the dipole material is collectively determined by the number of deposition cycles, the annealing temperature, and the anneal time duration. The disclosure above describes adopting a particular number of deposition cycle first (e.g. the number of deposition cycle that exceeds the saturation level) and then adjusting the threshold voltage primarily based on the annealing temperature. Alternatively, the annealing temperature may be first determined based on certain design requirements, such that tuning of the number of deposition cycle may be used as the primary way of adjusting the threshold voltage. Similarly, the annealing time duration may also be used to fine tune the threshold voltage either independently or in conjunction with the other parameters. Regardless of specific approaches, these methods enable the control of the concentration of the dipole materials within the high-k gate dielectric layer 282'. Such concentration may be manifested as the ratio of the dipole element (e.g. aluminum) and the metal element of the high-k gate dielectric layer 282. FIG. 19C illustrates concentration profile of various elements, based on Energy Dispersive X-ray spectroscopy (EDS) data, in a device fabricated according to embodiments of the present disclosure. In this example, the high-k gate dielectric layer 282 includes hafnium oxide, and the dipole element is aluminum. Accordingly, majority of the hafnium element is within boundaries surfaces 295 and 297 of the high-k gate dielectric layers 282'. Moreover, majority of the aluminum element is also within the boundaries surfaces 295 and 297. In some embodiments, the ratio of the aluminum concentration (evaluated based on the EDS signal intensity) to the hafnium concentration (evaluated based on the EDS signal intensity), at the boundary surfaces 295 and 297 may each be configured to be about 1:4 to about 1:1.5. In some embodiments, the ratio of the aluminum concentration to the hafnium concentration may each be configured to be about 1:3 to about 1:2. In some embodiments, the ratio of the aluminum concentration to the hafnium concentration at an artificial plane 299 cutting through the high-k gate dielectric layer 282' at its middle thickness may be configured to be about 1:8 to about 1:3. In some embodiments, the ratio of the aluminum concentration to the hafnium concentration at the artificial plane 299 may be configured to be about 1:6 to about 1:4. If the concentration of the dipole material (or its ratio relative to the metal element of the high-k gate dielectric layer 282) is too small, there may be insufficient capacity of threshold voltage tuning. Conversely, if the concentration (or ratio) is too large, any additional benefit may not justify the extra cost.

Figure 14:
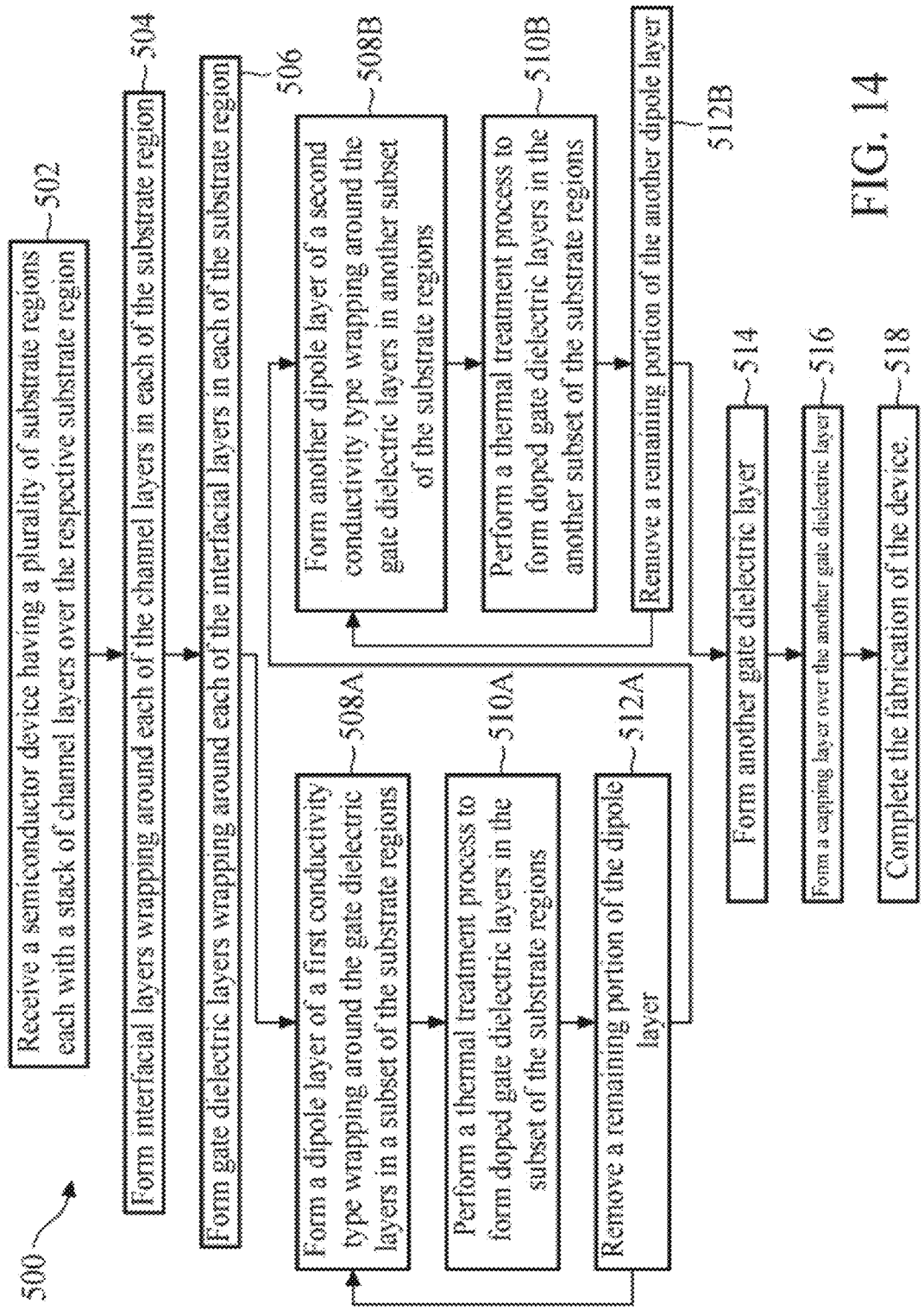

In some embodiments, the methods described above is implemented to form p-type dipoles within the high-k gate dielectric layer 282 of a transistor, for example, so as to reduce the threshold voltage of a p-type transistor or to increase the threshold voltage of an n-type transistor. In some embodiments, the methods described above may be implemented in conjunction with the forming of n-type dipoles on the same device. FIG. 14 provides a flow chart for a method 500 according to this aspect of the disclosure. FIGS. 15A-15D illustrate a portion of the method 500 associated with the n-type dipole formation on a device 400; and FIGS. 16A-16D illustrate a portion of the method 500 associated with the p-type dipole formation on the device 400. The device 400 includes device region 402a and device regions 402b, each resembling the substrate 202 of FIGS. 2B-2C. The device regions 402a and 402b may include the same or different dopant types. Furthermore, the device regions 402a and 402b may be adjacent to each other or remote from each other. The device region 402a further includes sub-regions 1402A and 1402A' each configured for transistors with different threshold voltages; and the device region 402b further includes sub-regions 1402B and 1402B' each configured for transistors with different threshold voltages.

Figure 15:
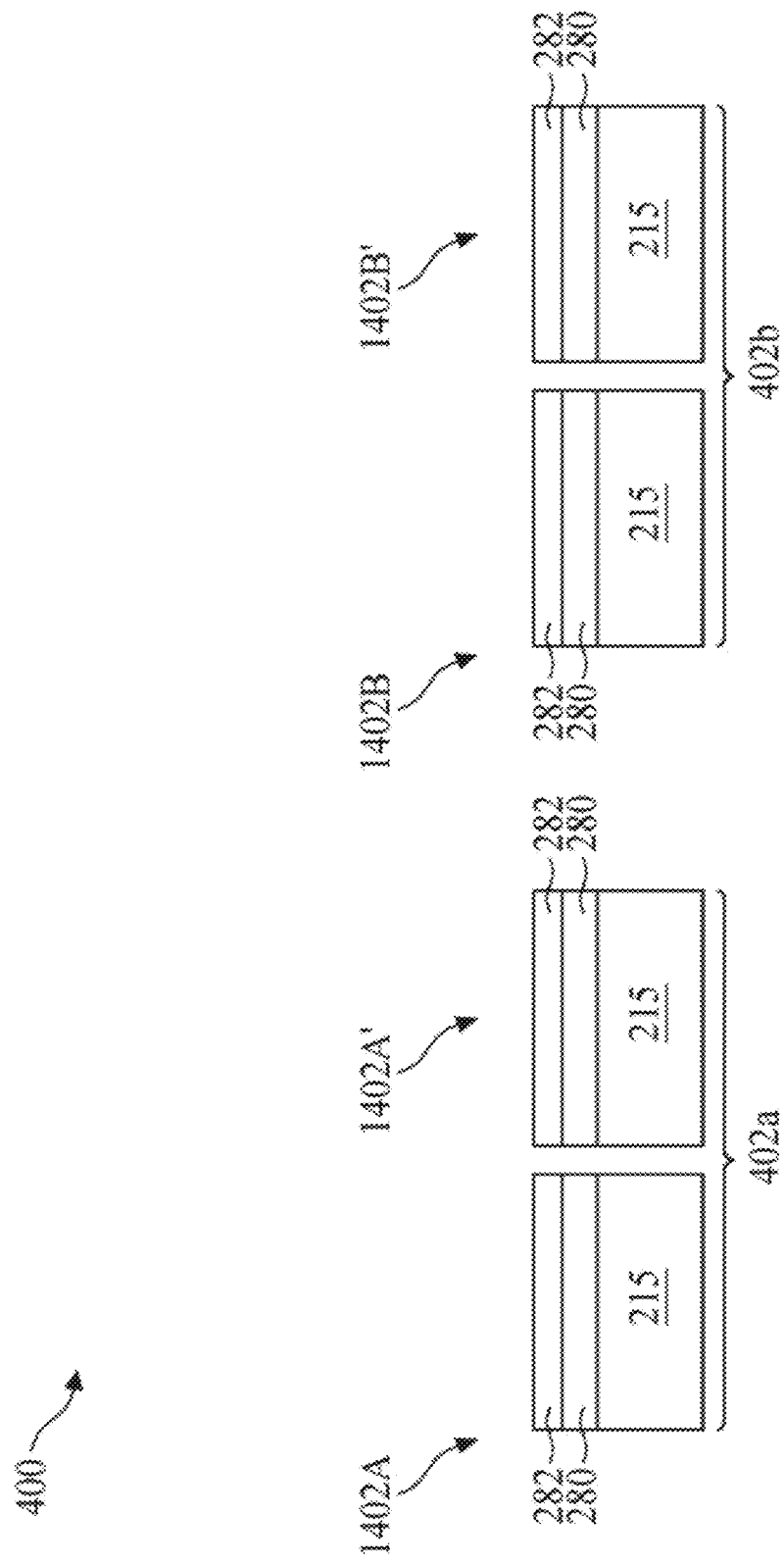

Referring now to FIG. 15, at operation 502 (FIG. 14), the method 500 receives or is provided with a semiconductor device 400 having the device regions 402a and 402b. The device regions 402a, 402b each includes sub-regions 1402A, 1402A' and 1402B, 1402B', respectively. Each of the sub-regions 1402A, 1402A' and 1402B, 1402B' include initial structures formed thereon, which resemble those described above with respect to FIGS. 2A-2C. Accordingly, subsequent figures have been further abbreviated to illustrate only relevant portions of the structures. For example, only the channel layers 215, interfacial layers 280, high-k dielectric layers 282, dipole layers (as described below), as well as mask layers are illustrated in subsequent figures. At operations 504 of the method 500 (FIG. 15), interfacial layers 280 are formed wrapping around each of the channel layers 215 in each of the substrate regions. At operations 506 of the method 500 (FIG. 15), gate dielectric layers 282 are formed wrapping around each of the interfacial layers 280 in each of the substrate region. The interfacial layers 280 and the gate dielectric layers 282 may be similar to those already described above with respect to the method 100.

Figure 16A:
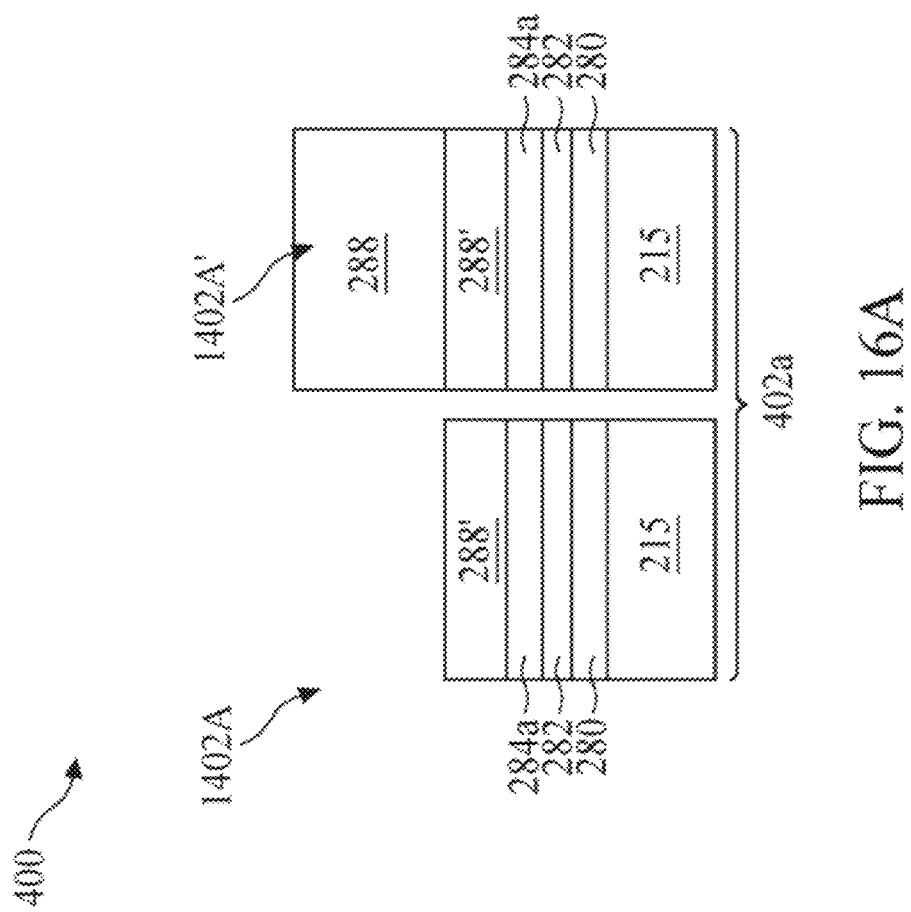
Figure 16B:
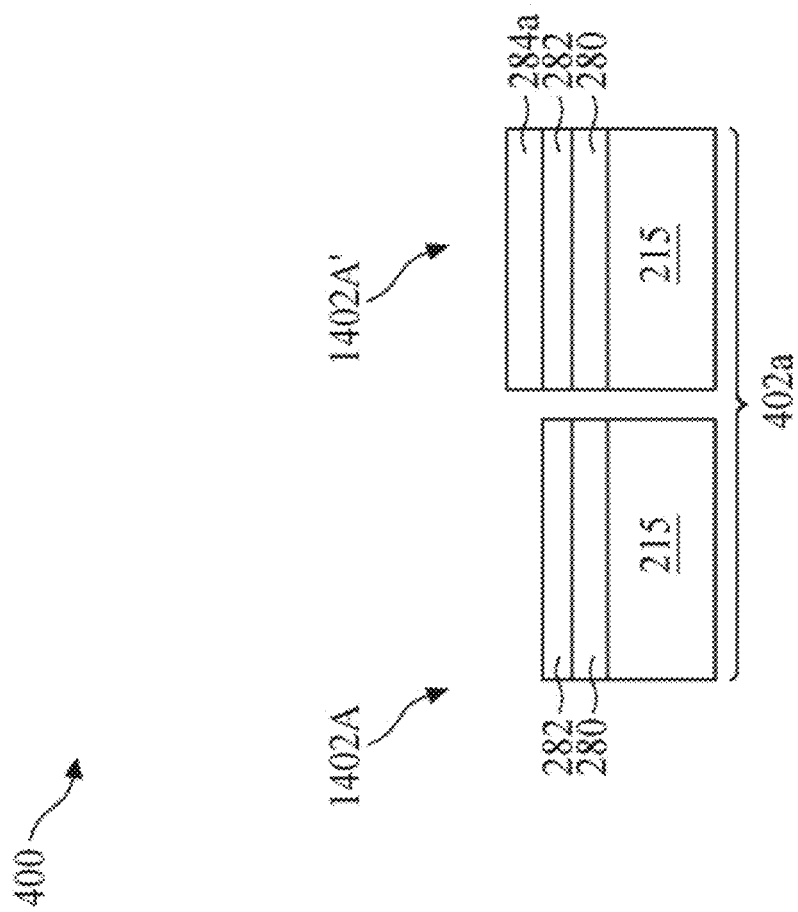
Figure 17B:
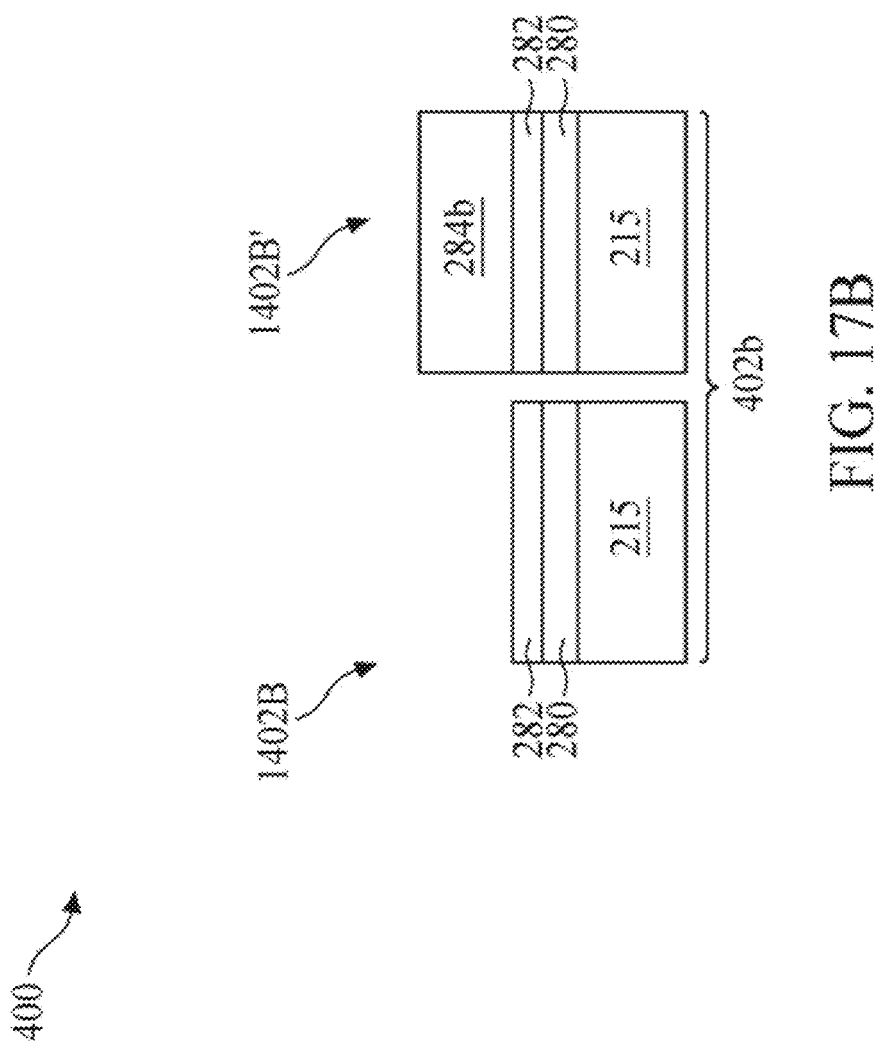
Figure 17C:
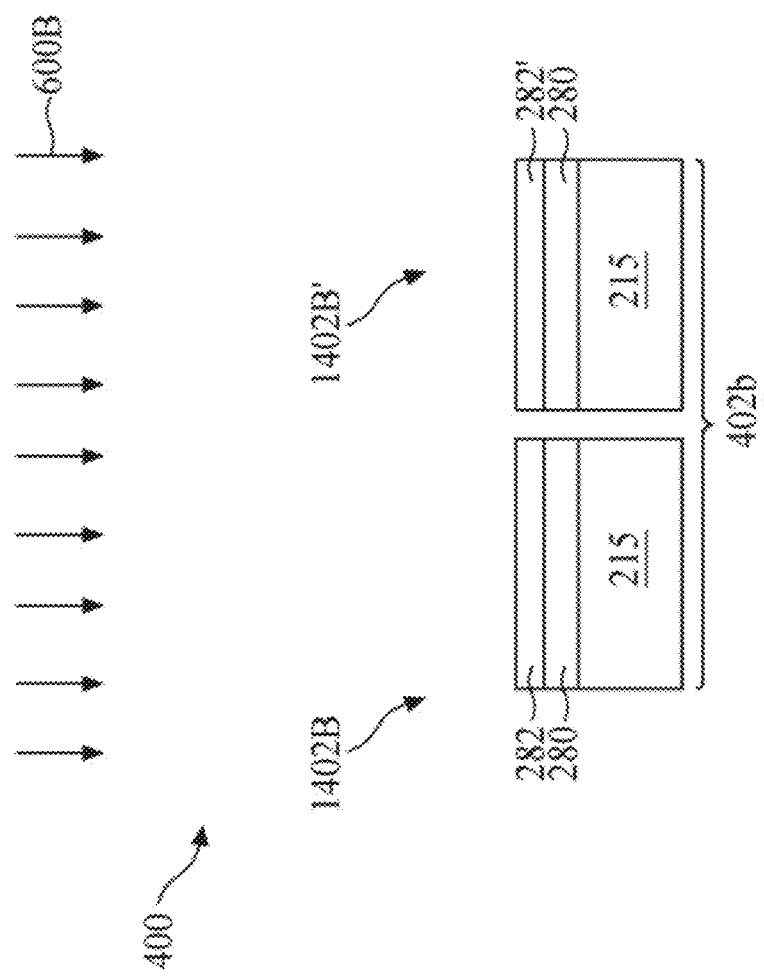

At this processing stage, the processing for the device regions 402a and 402b diverge. In some embodiments, the method 500 proceeds to process the device region 402a by introducing an n-type dipole layer 284a, as illustrated in FIGS. 16A-16C and associated with the operations 508A-512A of FIG. 14; while in some other embodiments, the method 500 proceeds to process the device region 402b by introducing a p-type dipole layer 284b, as illustrated in FIGS. 17A-17C and associated with the operations 508B-512B of FIG. 14.

In some embodiments, the device region 402a is processed prior to the device region 402b. In other words, the operations 508A-512A of FIG. 14 is conducted earlier than the operations 508B-512B of FIG. 14. This may be referred to as a "p-dipole last" approach. For example, a mask element is formed to cover the device region 402b, such that all operations are directed to the device region 402a. At operation 508A, the method 500 (FIG. 14) proceeds to form a dipole layer 284a surrounding and interfacing with the surfaces of the high-k gate dielectric layer 282 (FIG. 16A). In some embodiments, the dipole layer 284a is an n-type dipole layer and includes an n-type dipole material. For example, the dipole layer 284a includes lanthanum oxide ($La_2O_3$), yttrium oxide ($Y_2O_3$), other suitable n-type dipole materials, or combinations thereof. Moreover, a hard mask layer 288' is formed surrounding the dipole layer 284a. The hard mask layer 288' includes a suitable hard mask material. In some embodiments, the hard mask material may be aluminum oxide. Thereafter, a dielectric layer 288 is formed over the device region 402a and patterned to cover only the sub-region 1402A' while exposing the sub-region 1402A in the gate trenches 275. The patterned dielectric layer 288 may be formed using methods similar to those already described with respect to FIG. 6. Referring to FIG. 16B, an etching operation removes the portion of the hard mask layer 288' exposed in the gate trenches 275, as well as the portion of the dipole layer 284a thereunder. Accordingly, the high-k gate dielectric layer 282 in the sub-region 1402A becomes exposed. Meanwhile, the portion of the hard mask layer 288' and the portion of the dipole layer 284a covered by the patterned dielectric layer 288 remain intact. Subsequently, the patterned dielectric layer 288 may be removed using a suitable method (such as an ashing operation), and the hard mask layer 288' may be removed using a suitable method (such as wet etching). As a result, the dipole layer 284a is present in the sub-region 1402A' and exposed in the gate trenches 275, but absent in the sub-region 1402A. At operation 510A, a thermal treatment process 600A is conducted on the device 400 (FIG. 16C). As a result, dipole materials within the dipole layer 284a is driven thermally into the portion of the high-k gate dielectric layer 282 in the sub-region 1402A'. The high-k gate dielectric layer 282 so modified is referred to as the high-k gate dielectric layer 282". The modified high-k gate dielectric layer 282" may be similar to the high-k gate dielectric layer 282' described above with respect to FIG. 9 except that the dipole material is different. In other words, the modified high-k gate dielectric layer 282" includes an n-type dipole material rather than a p-type dipole material (e.g. aluminum oxide). Because no dipole layer 284a is present in the sub-region 1402A, the high-k gate dielectric layer 282 there remains unmodified. In some embodiments, the thermal treatment process 600A may implement a temperature of about 600° C. to about 750° C. If the temperature is too low, the amount of the dipole material driven into the high-k gate dielectric layer 282 may be too little to allow for effective threshold voltage tuning; if the temperature is too high, the migration behavior may be difficult to control. Thereafter, any remaining portions of the dipole layer 284a still present is removed using a suitable method (operation 512A of FIG. 14).

The above processing provides various sub-regions with differently configured gate dielectric layers. These sub-regions, after the subsequent formation of gate electrode layers thereon, provide transistors with different threshold voltages. In some embodiments, the operations 508A-512A are repeated, although in different subsets of device regions (or sub-regions). Moreover, the dipole materials implemented in the dipole layer 284a, the anneal temperature and/or time duration, as well as the etching parameters may vary from the first cycle of the operations 508A-512A. Accordingly, portions of the gate dielectric layer may be further differentiated with respect to their dipole configurations. In some embodiments, the operations 508A-512A are repeated twice before further processing is conducted.

In some embodiments, the method 500 proceeds to process the device region 402b, for example, with the processed device region 402a covered under a mask element. In some embodiments, this portion of processing are similar to those already described above with respect to FIG. 1 and FIGS. 3-12. Accordingly, subsequent descriptions are abbreviated. In some embodiments, the method 500 proceeds to form another dipole layer 284b in the device region 402b (operation 508B of FIG. 14). The dipole layer 284b is formed interfacing with the high-k gate dielectric layer 282 directly. In some embodiments, the dipole layer 284b may be similar to the dipole layer 284 described above with respect to FIGS. 4-8, and may undergo the same processing described above with respect to FIGS. 4-8. In some embodiments, the dipole layer 284b is different from the dipole layer 284a. For example, the dipole layer 284b may include aluminum oxide. Moreover, dipole layer 284b may be configured with a thickness greater than half of the vertical separation between vertically adjacent portions of the high-k gate dielectric layer 282. Accordingly, the dipole layer 284b merges within the spacing between channel layers. Furthermore, the outer surfaces of the dipole layer 284b may be recessed (similar to operation 108 of FIG. 1). For example, the dipole layer 284b on sidewall surfaces of the dielectric fins 231, on top surfaces of the topmost channel layers 215, and on sidewall surfaces of the channel layers 215 are recessed. However, the dipole layer 284b between vertically adjacent channel layers 215 are not substantially recessed beyond the outmost edges. Accordingly, the dipole layer 284b may serve as a hard mask layer in a subsequent patterning operation. Thereafter, the device is patterned (similar to operations 110-112 of FIG. 1) (FIGS. 17A-17B).

Subsequently, the method 500 proceeds to anneal the device 400 in a thermal treatment process 600B, thereby driving the dipole material of the dipole layer 284b into the portion of the high-k gate dielectric layer 282 it interfaces with. In some embodiments, the thermal treatment process 600B may implement a temperature higher than the temperature of process 600A. Without being limited by theory, the diffusion of aluminum oxide may be more difficult than lanthanum oxide and require a higher temperature. In some embodiments, the process 600B may implement a temperature of about 850° C. to about 900° C. In other words, the temperature of process 600B may be greater than that of the process 600A by about 100° C. to about 300° C. If the temperature is too low, or if the temperature difference is too small, the amount of the dipole material driven into the high-k gate dielectric layer 282 may be too little to allow for effective threshold voltage tuning; if the temperature is too high, or if the temperature difference is too large, the migration behavior may be difficult to control. Thereafter, any remaining portions of the dipole layer 284b still present is removed using a suitable method (operation 512B of FIG. 14).

Figure 18:
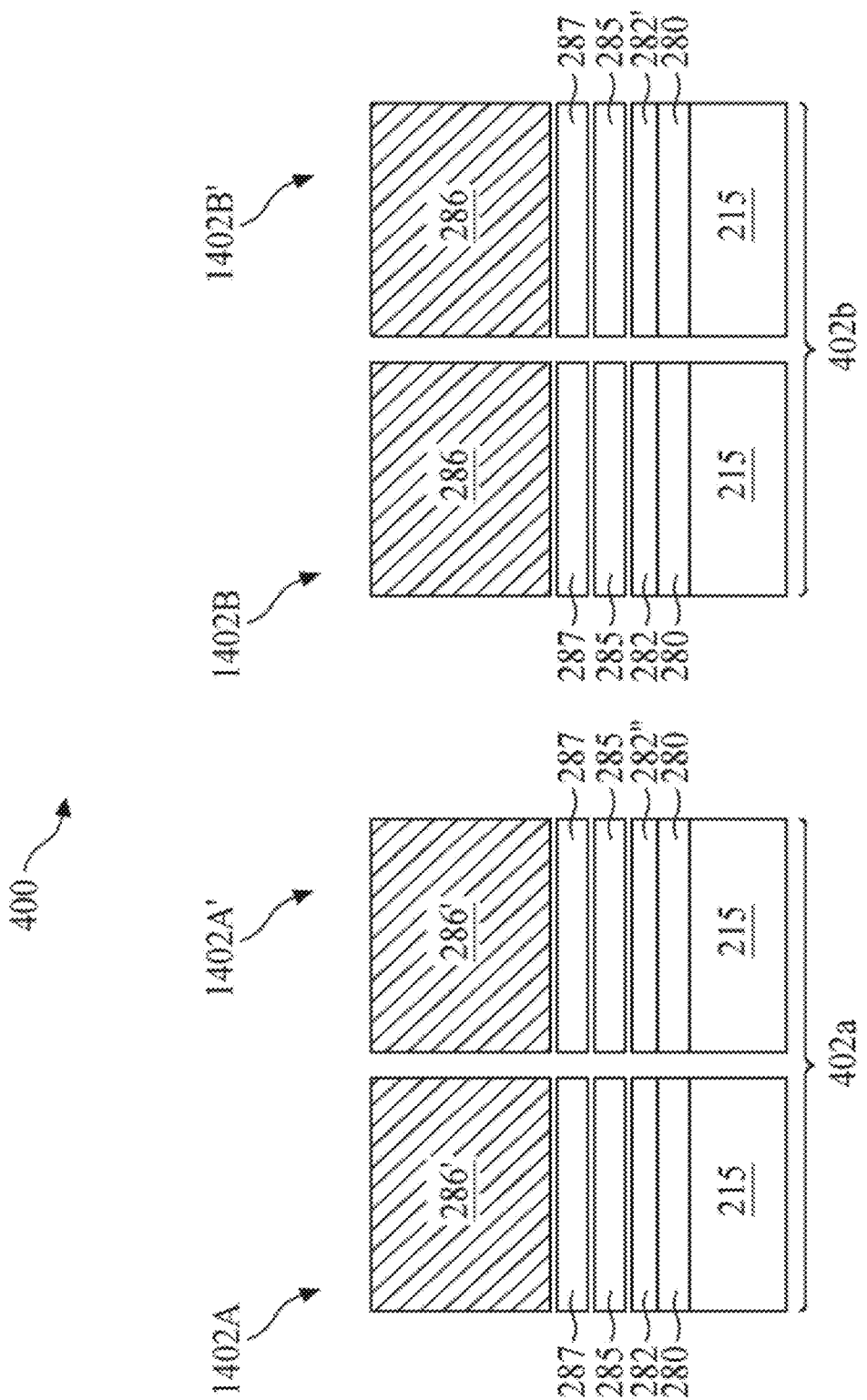

In the depicted embodiment of FIG. 17C, the dipole materials are driven into the portion of the high-k gate dielectric layer 282 in sub-region 1402B' but not in the sub-region 1402B. As a result, the high-k gate dielectric layer 282 remains unmodified in sub-region 1402B, but is converted into modified high-k gate dielectric layer 282' in sub-region 1402B'. In some embodiments, the modified high-k gate dielectric layer 282' is similar to the high-k gate dielectric layer 282' described above with respect to FIG. 9. Accordingly, the sub-region 1402B includes an unmodified high-k gate dielectric layer 282, while the sub-region 1402B' includes a modified high-k gate dielectric layer 282'. Similarly, the operations 508B-512B may be repeated to provide gate dielectric layer portions with further varying compositions of the dipole materials. At operations 514-518, method 500 proceeds to form another high-k gate dielectric layer 285 covering the modified high-k gate dielectric layers 282", 282', and unmodified high-k gate dielectric layer 282. A capping layer 287 is formed over the high-k gate dielectric layer 285, and gate electrode layer 286 or 286' is formed over the capping layer 287. Additional layers may be formed to complete the device fabrications (FIG. 18).

The description above provides processing the n-type dipole in device region 402a prior to the processing of the p-type dipoles in device region 402b. In some alternative embodiments, the device region 402b is processed prior to the device region 402a. In other words, the operations 508B-512B of FIG. 14 is conducted earlier than the operations 508A-512A of FIG. 14. This may be referred to as a "p-dipole first" approach. In some embodiments, the "p-dipole last" approach offers various benefits over the "p-dipole first" approach. For example, in some embodiments, the forming of the p-dipole layers first may adversely affect the tuning capability of the n-type dipoles; while such adverse effect is absent in a "p-dipole last" approach. Moreover, the thermal treatment process in a "p-dipole last" approach provides a tuning capability of the flat band voltage ($V_{fb}$) by about 40 mV to about 90 mV; while the same thermal treatment process in a "p-dipole first" approach provides a tuning capability of merely about 10 mV to about 30 mV. Furthermore, the "p-dipole last" approach presents reduced risk with respect to N-dipole gate fill, DC % penalty and leakage, as compared to the "p-dipole first" approach. Further fabrication steps may be provided to complete the fabrication of the device 200 or device 400. For example, source/drain contacts, vias, metal lines, passivation features, and other suitable features may be formed to complete the IC. Although not intended to be limiting, one or more embodiments of the present disclosure provide many benefits to a semiconductor device and the formation thereof. For example, using embodiments of the present disclosure, aluminum oxide may be implemented as a p-type dipole material and used in conjunction with n-type dipole materials to provide additional threshold voltages offerings. For example, in some embodiments, lanthanum oxide may be implemented in one or more cycles of operations 508A-512A; and aluminum oxide may be implemented in one or more cycles of operations 508B-512B. The number of available threshold voltages therefore increase as compared to approaches that implement only lanthanum oxides. Device overall performances are thereby improved. Moreover, embodiments of the present disclosure enable multi-Vt offerings previously challenging to provide. For example, embodiments of the present disclosure provide threshold voltages tunable range of more than about 300 mV to about 400 mV. For example, in some embodiments, methods described here may provide threshold voltage tunable range of about 300 mV to about 550 mV, such as about 400 mV to about 500 mV. In approaches not implementing methods described here, it may be challenging to achieve a broad tunable range like these. Furthermore, the implementation of p-type dipoles according to embodiments of the present disclosure enables fabricating devices previously challenging to fabricate. For example, by implementing the p-dipoles as described, PFET with extremely low threshold voltages may be achieved (such as eLVT devices and xLVT devices). Likewise, implementing the p-dipoles as described, NFET with super low leakage values may be achieved (such as S_LLVT-1 devices and S_LLVT-2 devices).

Although not explicitly described, one of ordinary skills in the art would understand that aspects of the present disclosure may be applied to other types of devices, such as FinFET, planar MOSFETs, other multi-gate FETs, or other similar devices. Those devices are contemplated within the disclosure.

In one example aspect, the present disclosure is directed to a method. The method includes receiving a workpiece having a first stack of semiconductor layers in a first region and a second stack of semiconductor layers in a second region; forming a first gate dielectric layer surrounding each layer of the first stack and a second gate dielectric layer surrounding each layer of the second stack; forming a first dipole layer surrounding the first gate dielectric layer and merging between vertically adjacent portions of the first gate dielectric layer, and a second dipole layer surrounding the second gate dielectric layer and merging between vertically adjacent portions of the second gate dielectric layer; removing the first dipole layer; after the removing of the first dipole layer, conducting a first annealing on the workpiece; removing a remaining portion of the second dipole layer; and forming a gate electrode layer in the first region and the second region.

In an embodiment of the method, the annealing of the workpiece drives a dipole material of the second dipole layer into the second gate dielectric layer. In another embodiment, the second dipole layer includes a first oxide material having a first oxygen areal density, and the second gate dielectric layer includes a second oxide material having a second oxygen areal density, and the first oxygen areal density is greater than the second oxygen areal density.

In an embodiment of the method, the first dipole layer and the second dipole layer each include aluminum oxide, and the first gate dielectric layer and the second gate dielectric layer each include hafnium oxide.

In an embodiment, the forming of the second dipole layer includes forming a precursor layer surrounding the second gate dielectric layer and recessing the precursor layer to form the second dipole layer. In a further embodiment, the recessing of the precursor layer expands a lateral dimension of an opening between the second stack of semiconductor layers and an adjacent dielectric fin.

In an embodiment, the method further includes, prior to the removing of the first dipole layer, forming a bottom anti-reflective coating (BARC) layer covering the second stack of semiconductor layers, the BARC layer having an opening exposing the first stack of semiconductor layers, wherein the BARC layer directly interfaces with the second dipole layer.

In an embodiment, the removing of the first dipole layer includes etching with ammonium hydroxide. In another embodiment, the conducting of the annealing includes conducting at a temperature of about 850° C. to about 900° C. In another embodiment, adjacent semiconductor layers of the second stack of semiconductor layers are vertically separated from each other by a first distance, the second dipole layer has a layer thickness on a sidewall surface of the second dipole layer, and the layer thickness is equal to or is greater than half of the first distance.

In an embodiment, the receiving of the workpiece includes receiving the workpiece further having a third stack of semiconductor layers in a third region and the conducting of the first annealing includes conducting at a first temperature, and the method further includes forming a third gate dielectric layer surrounding each layer of the third stack; forming another dipole layer surrounding the third gate dielectric layer; and conducting a second annealing on the workpiece at a second temperature, wherein the first temperature is greater than the second temperature, and wherein the second dipole layer includes aluminum, and the another dipole layer includes lanthanum oxide.

In another example aspect, the present disclosure is directed to a method. The method includes receiving a semiconductor device having a plurality of substrate regions each with a stack of channel layers thereon; forming interfacial layers wrapping around each channel layer in each of the substrate regions; forming gate dielectric layers wrapping around each of the interfacial layers in each of the substrate region; forming a dipole layer wrapping around the gate dielectric layers in a subset of the substrate regions, the dipole layer having a p-type dipole material filling a spacing between vertically adjacent channel layers; performing a thermal treatment process to form doped gate dielectric layers in the subset of the substrate regions; removing a remaining portion of the dipole layer; and forming a gate electrode layer surrounding the doped gate dielectric layers.

In an embodiment, the p-type dipole material is aluminum oxide. In an embodiment, the method further includes forming another dipole layer wrapping around the gate dielectric layers in another subset of the substrate regions, the another dipole layer having an n-type dipole material; performing another thermal treatment process to form another doped gate dielectric layers in the another subset of the substrate regions; and removing a remaining portion of the another dipole layer. In a further embodiment, the p-type dipole material is aluminum oxide, and the n-type dipole material is lanthanum oxide. In another further embodiment, the forming of the another dipole layer is conducted after the performing of the thermal treatment process.

In yet another example aspect, the present disclosure is directed to a semiconductor device. The semiconductor device includes a semiconductor substrate; a first stack of channel layers and a second stack of channel layers on the semiconductor substrate; a first gate dielectric layer surrounding layers of the first stack of channel layers, the first gate dielectric layer including a p-type dipole material; a second gate dielectric layer surrounding layers of the second stack of channel layers, the second gate dielectric layer including an n-type dipole material; and a gate electrode on the first gate dielectric layer and on the second gate dielectric layer.

In an embodiment, the p-type dipole material is aluminum oxide, and the n-type dipole material is lanthanum oxide. In a further embodiment, the first gate dielectric layer includes hafnium oxide, and wherein a ratio of a concentration of aluminum to a concentration of hafnium in the first gate dielectric layer is about 1:3 to about 1:2 at a surface of the first gate dielectric layer.

In another embodiment, the first gate dielectric layer includes a gate dielectric material having a first metal element, and the p-type dipole material includes a second metal element, and a ratio of a concentration of the second metal element to the first metal element is about 1:6 to about 1:4 at a middle thickness of the first gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    receiving a workpiece having a first stack of semiconductor layers in a first region and a second stack of semiconductor layers in a second region;
    forming a first gate dielectric layer surrounding each layer of the first stack and a second gate dielectric layer surrounding each layer of the second stack;
    forming a first dipole layer surrounding the first gate dielectric layer and merging between vertically adjacent portions of the first gate dielectric layer, and a second dipole layer surrounding the second gate dielectric layer and merging between vertically adjacent portions of the second gate dielectric layer;
    recessing the first dipole layer and the second dipole layer to reduce a thickness of each of the first dipole layer and the second dipole layer;
    after the recessing, selectively removing the first dipole layer;
    after the selectively removing of the first dipole layer, conducting a first annealing on the workpiece;
    after the conducting of the first annealing, removing a remaining portion of the second dipole layer; and
    forming a gate electrode layer in the first region and the second region.

2. The method of claim 1, wherein the first annealing of the workpiece drives a dipole material of the second dipole layer into the second gate dielectric layer.

3. The method of claim 1, wherein the second dipole layer includes a first oxide material having a first oxygen areal density, and the second gate dielectric layer includes a second oxide material having a second oxygen areal density, and the first oxygen areal density is greater than the second oxygen areal density.

4. The method of claim 1, wherein the first dipole layer and the second dipole layer each include aluminum oxide, and
    wherein the first gate dielectric layer and the second gate dielectric layer each include hafnium oxide.

5. The method of claim 1, wherein the forming of the second dipole layer includes:
    forming a precursor layer surrounding the second gate dielectric layer; and
    recessing the precursor layer to form the second dipole layer.

6. The method of claim 5, wherein the recessing of the precursor layer expands a lateral dimension of an opening between the second stack of semiconductor layers and an adjacent dielectric fin.

7. The method of claim 1, further comprising:
    prior to the removing of the first dipole layer, forming a bottom anti-reflective coating (BARC) layer covering the second stack of semiconductor layers, the BARC layer having an opening exposing the first stack of semiconductor layers,
    wherein the BARC layer directly interfaces with the second dipole layer.

8. The method of claim 1, wherein the removing of the first dipole layer includes etching with ammonium hydroxide.

9. The method of claim 1, wherein the conducting of the first annealing includes conducting at a temperature of about 850° C. to about 900° C.

10. The method of claim 1, wherein adjacent semiconductor layers of the second stack of semiconductor layers are vertically separated from each other by a first distance,
    wherein the second dipole layer has a layer thickness on a sidewall surface of the second dipole layer, and
    wherein the layer thickness of the second dipole layer is equal to or is greater than half of the first distance.

11. The method of claim 1, wherein:
    prior to the forming of a gate electrode layer, forming a high-k gate dielectric layer over the first region and the second region.

12. A method, comprising:
    receiving a semiconductor device having a plurality of substrate regions each with a stack of channel layers thereon;
    forming interfacial layers wrapping around each channel layer in each of the substrate regions;
    forming gate dielectric layers wrapping around each of the interfacial layers in each of the substrate region;
    selectively forming a dipole layer wrapping around the gate dielectric layers in a subset of the substrate regions, the dipole layer filling a spacing between vertically adjacent channel layers;
    performing a thermal treatment process to form doped gate dielectric layers in the subset of the substrate regions;
    removing a remaining portion of the dipole layer in the subset of the substrate regions;
    after the removing the remaining portion of the dipole layer, forming a high-k gate dielectric layer around the gate dielectric layers and the doped gate dielectric layers in all of the plurality of substrate regions; and forming a gate electrode layer surrounding the high-k gate dielectric layers.

13. The method of claim 12, the dipole layer includes aluminum oxide.

14. The method of claim 12, wherein the removing the remaining portion of the dipole layer includes use of wet etching.

15. The method of claim 12, wherein the high-k gate dielectric layer includes hafnium oxide.

16. The method of claim 12, wherein the thermal treatment process includes annealing at a temperature of about 850° C. to about 900° C.

17. A method to form a semiconductor device, comprising:
   forming a first stack of channel layers and a second stack of channel layers on a semiconductor substrate;
   forming a first gate dielectric layer wrapping around the first stack of channel layers;
   forming a second gate dielectric layer wrapping around the second stack of channel layers;
   forming a first dipole layer surrounding the first gate dielectric layer and a second dipole layer surrounding the second gate dielectric layer;
   recessing the first dipole layer and the second dipole layer;
   after the recessing, selectively removing the first dipole layer;
   after the selectively removing of the first dipole layer, annealing the semiconductor device;
   after the annealing, removing a remaining portion of the second dipole layer; and
   forming a gate electrode layer over the first gate dielectric layer and the second gate dielectric layer.

18. The method of claim 17, wherein the first dipole layer and second dipole layer each include aluminum oxide.

19. The method of claim 17,
   wherein the first stack of channel layers is disposed between a first dielectric fin and a second dielectric fin,
   wherein the forming of the first dipole layer comprises forming the first dipole layer along sidewalls and top surfaces of the first dielectric fin and the second dielectric fin.

20. The method of claim 17, wherein the annealing comprises a temperature of about 850° C. to about 900° C.

* * * * *